(12) United States Patent
Tanaka et al.

(10) Patent No.: US 7,596,776 B2
(45) Date of Patent: Sep. 29, 2009

(54) LIGHT INTENSITY DISTRIBUTION SIMULATION METHOD AND COMPUTER PROGRAM PRODUCT

(75) Inventors: Satoshi Tanaka, Kawasaki (JP); Shoji Mimotogi, Yokohama (JP); Takashi Sato, Fujisawa (JP); Soichi Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 365 days.

(21) Appl. No.: 11/730,102

(22) Filed: Mar. 29, 2007

(65) Prior Publication Data
US 2007/0234269 A1    Oct. 4, 2007

(30) Foreign Application Priority Data
Mar. 30, 2006    (JP) ............................. 2006-094847

(51) Int. Cl.
G06F 17/50    (2006.01)
(52) U.S. Cl. ................................. 716/21; 716/4; 716/20
(58) Field of Classification Search ........................ None
See application file for complete search history.

(56) References Cited
FOREIGN PATENT DOCUMENTS
JP    7-29813    1/1995

OTHER PUBLICATIONS

A. Wong et al., "TEMPEST version 6.0," Electronics Research Laboratory, University of California, Berkeley, Jun. 30, 2000, 37 pages.*
Pistor et al.; "Modeling Oblique Incidence Effects in Photomasks"; In Optical Microlithography XIII, J. Progler, Ed., Proceedings of SPIE, vol. 4000, pp. 228-237, (2000).

* cited by examiner

Primary Examiner—Leigh Marie Garbowski
(74) Attorney, Agent, or Firm—Finnegan, Henderson, Farabow, Garrett & Dunner, L.L.P.

(57) ABSTRACT

A light intensity distribution simulation method for predicting an intensity distribution of light on a substrate when photomask including a pattern is irradiated with light in which a shape distribution of an effective light source is defined includes extracting plural point light sources from a shape distribution of the effective light source, entering the light emitted from each of the plural point light sources onto the pattern of the photomask, calculating an effective shape for each of the plural point light sources, the effective shape being a pattern obtained by excluding a part which is not irradiated with the light directly due to a sidewall of a pattern film including the pattern from a design shape of an aperture of the pattern, and calculating a distribution of diffraction light generated in the pattern for each of the plural point light sources by using the effective shape.

18 Claims, 21 Drawing Sheets

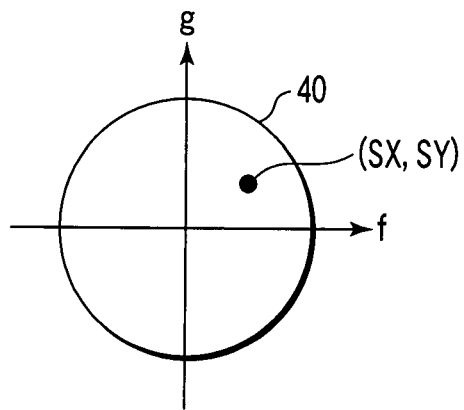
F I G. 16
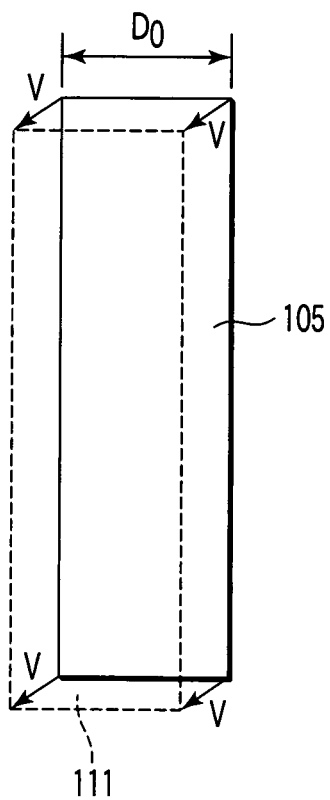
F I G. 17

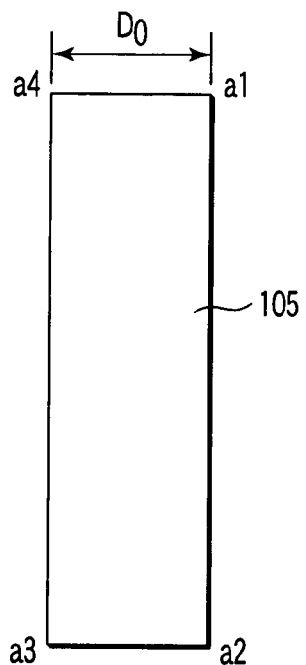
F I G. 20
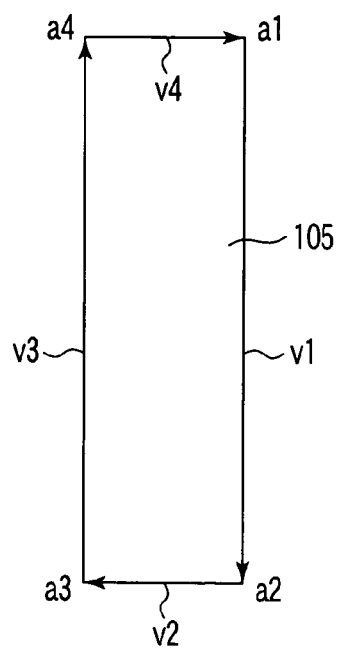
F I G. 21

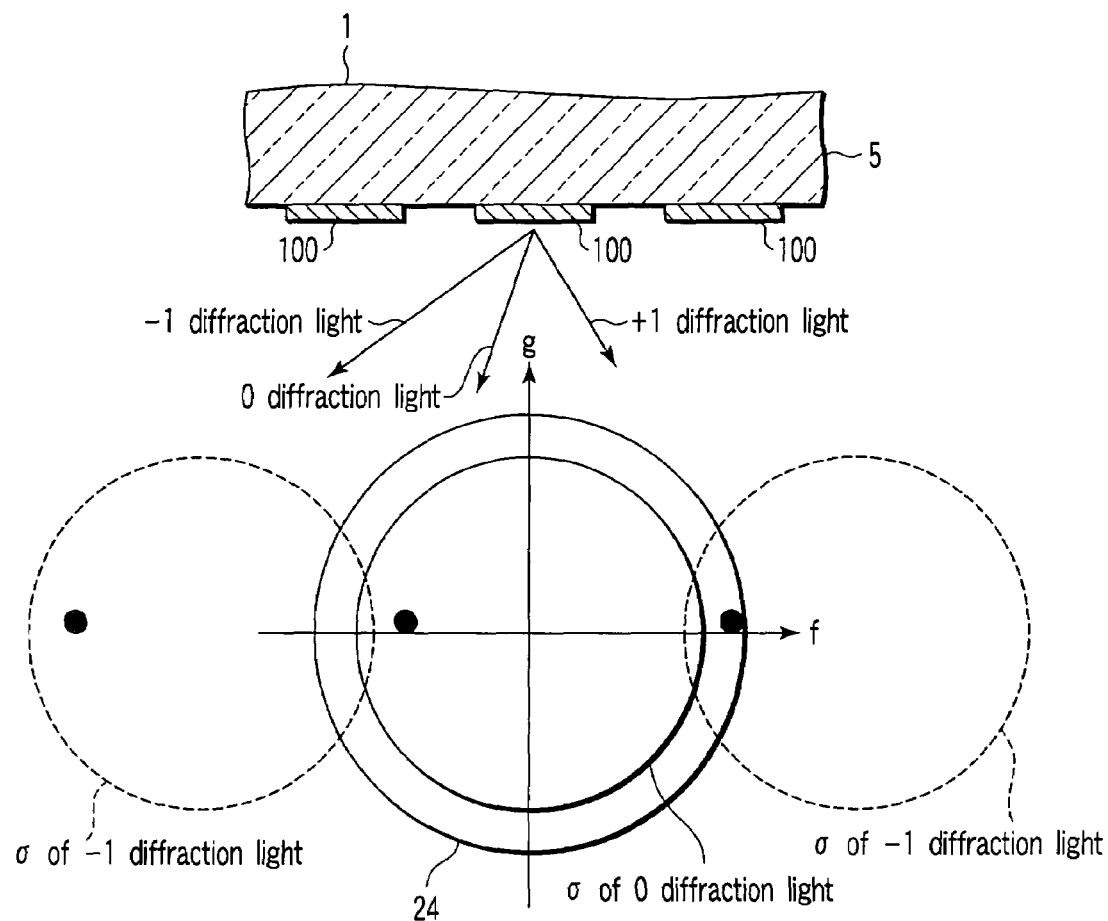
F I G. 34
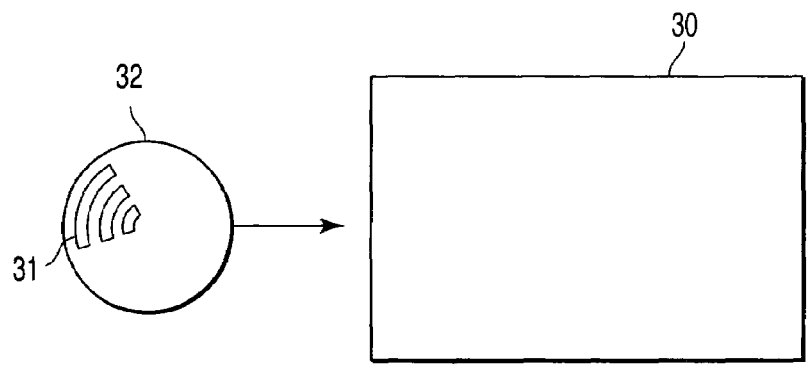
F I G. 36

LIGHT INTENSITY DISTRIBUTION SIMULATION METHOD AND COMPUTER PROGRAM PRODUCT

CROSS-REFERENCE TO RELATED APPLICATIONS

This application is based upon and claims the benefit of priority from prior Japanese Patent Application No. 2006-094847, filed Mar. 30, 2006, the entire contents of which are incorporated herein by reference.

BACKGROUND OF THE INVENTION

1. Field of the Invention

The present invention relates to a light intensity distribution simulation method for obtaining a distribution of light intensity on a substrate surface at a time of exposure in the lithography process and computer program product.

2. Description of Related Art

For miniaturization of a pattern formed on a wafer, it is attempted to increase a numerical aperture NA of an exposure apparatus used for pattern forming. Therefore, an incident angle of light to a photomask and a wafer has been more increased. The incident angle of light especially to a surface of the photomask is so increased as to affect the pattern forming unfavorably.

The photomask comprises a pattern film having a film thickness such as a light shielding portion or a phase shifter portion. Because of a sidewall of the pattern film, a part which is not irradiated with the light generates in an aperture of the photomask. As a result, there arises a problem called shadowing in which an effective aperture ratio of the photomask fluctuates.

In consideration of the problem, in order to predict a pattern formed on a wafer according to a simulation, it is necessary to calculate the light diffraction phenomena generated in the aperture strictly based on a three-dimensional structure of a photomask. However, the calculation of diffraction phenomena based on the three-dimensional structure takes an immense time even with a high performance computer (for example, refer to Jpn. Pat. Appln. KOKAI Publication No. 7-29813).

BRIEF SUMMARY OF THE INVENTION

According to an aspect of the present invention, there is provided a light intensity distribution simulation method for predicting an intensity distribution of light on a substrate when a pattern formed on a photomask is irradiated with light in which a shape distribution of an effective light source is defined, by using an illumination optical system, and the light which passes through the photomask is projected on the substrate through a projection optical system, the method comprising: extracting a plurality of point light sources from the shape distribution of the effective light source; entering the light which is emitted from each of the plurality of point light sources in the pattern on the photomask; calculating an effective shape for each of the plurality of point light sources, the effective shape being a pattern obtained by excluding a part which is not irradiated with the light directly due to a sidewall of a pattern film including the pattern from a design shape of an aperture of the pattern; and calculating a distribution of a diffraction light generated in the pattern for each of the plurality of point light sources by using the effective shape calculated for each of the plurality of point light sources.

According to an aspect of the present invention, there is provided a computer program product for predicting an intensity distribution of light on a substrate when a photomask comprising a pattern is irradiated with light in which a shape distribution of an effective light source is defined, by using an illumination optical system, and the light which passes through the photomask is projected on the substrate through a projection optical system, the computer program product configured to store program instructions for execution on a computer system enabling the computer system to perform: an instruction for extracting a plurality of point light sources from the shape distribution of the effective light source; an instruction for entering light in the pattern of the photomask, the light being emitted from each of the plurality of point light sources; an instruction for calculating an effective shape for each of the plurality of point light sources, the effective shape being a shape obtained by excluding a part from a design shape of an aperture of the pattern, the part being failed to be irradiated with the light directly due to a sidewall of a pattern film including the pattern; and an instruction for calculating a distribution of diffraction light generated in the pattern for each of the plurality of point light sources by using the effective shape calculated for each of the plurality of point light sources.

BRIEF DESCRIPTION OF THE SEVERAL VIEWS OF THE DRAWING

FIG. 16 is a second schematic view of the effective light source subjected to the light intensity distribution simulation system according to the first embodiment of the invention;

FIG. 17 is a schematic view of a design shape of an aperture and a dummy pattern aperture subjected to the light intensity distribution simulation system according to the first embodiment of the invention;

FIG. 20 is a schematic view of a design of an aperture subjected to a light intensity distribution simulation system according to a second embodiment of the invention;

FIG. 21 is a first schematic view of a side vector forming the design shape of the aperture subjected to the light intensity distribution simulation system according to the second embodiment of the invention;

FIG. 34 is a schematic view showing diffraction light generated in an aperture of a photomask according to the fifth embodiment of the invention;

FIG. 36 is a view for explaining a computer program product according to embodiment.

DETAILED DESCRIPTION OF THE INVENTION

Figure 1:
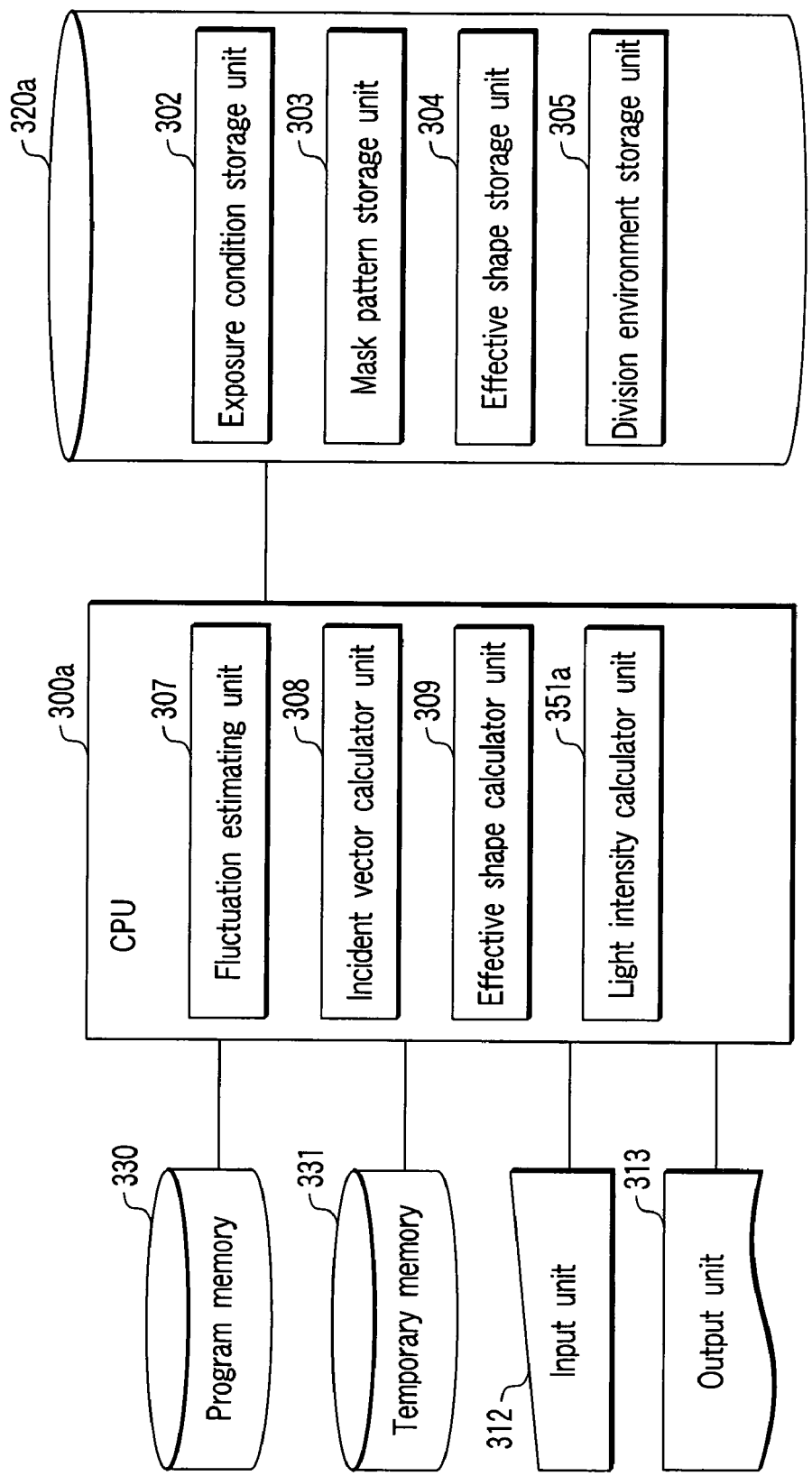
FIG. 1 is a block diagram showing a light intensity distribution simulation system according to a first embodiment of the invention.

Hereinafter, embodiments of the invention will be described referring to the drawings.

FIRST EMBODIMENT

As shown in FIG. 1, a light intensity distribution simulation system according to a first embodiment comprises a central processing unit (CPU) 300a. The central processing unit 300a comprises an incident vector calculator unit 308, an effective shape calculator unit 309, and a light intensity calculator unit 351a.

The incident vector calculator unit 308 extracts a plurality of point light sources from an effective light source formed by light which is emitted from an integrator of an exposure apparatus. Further, the incident vector calculator unit 308 calculates an incident vector of each light which is emitted from each of the plurality of point light sources and enter in a photomask including a pattern film having a film thickness.

The effective shape calculator unit 309 calculates a movement vector of the light on a plane parallel to the pattern film when the light proceeds the same distance as the film thickness of the pattern film in a direction vertical to the pattern film having a pattern including apertures. Further, the effective shape calculator unit 309 calculates the effective shape excluding a part which cannot be irradiated with light directly due to the sidewall of the pattern film, from a two-dimensional design shape of the apertures provided in the pattern film, for every point light source, using the movement vector.

Figure 2:
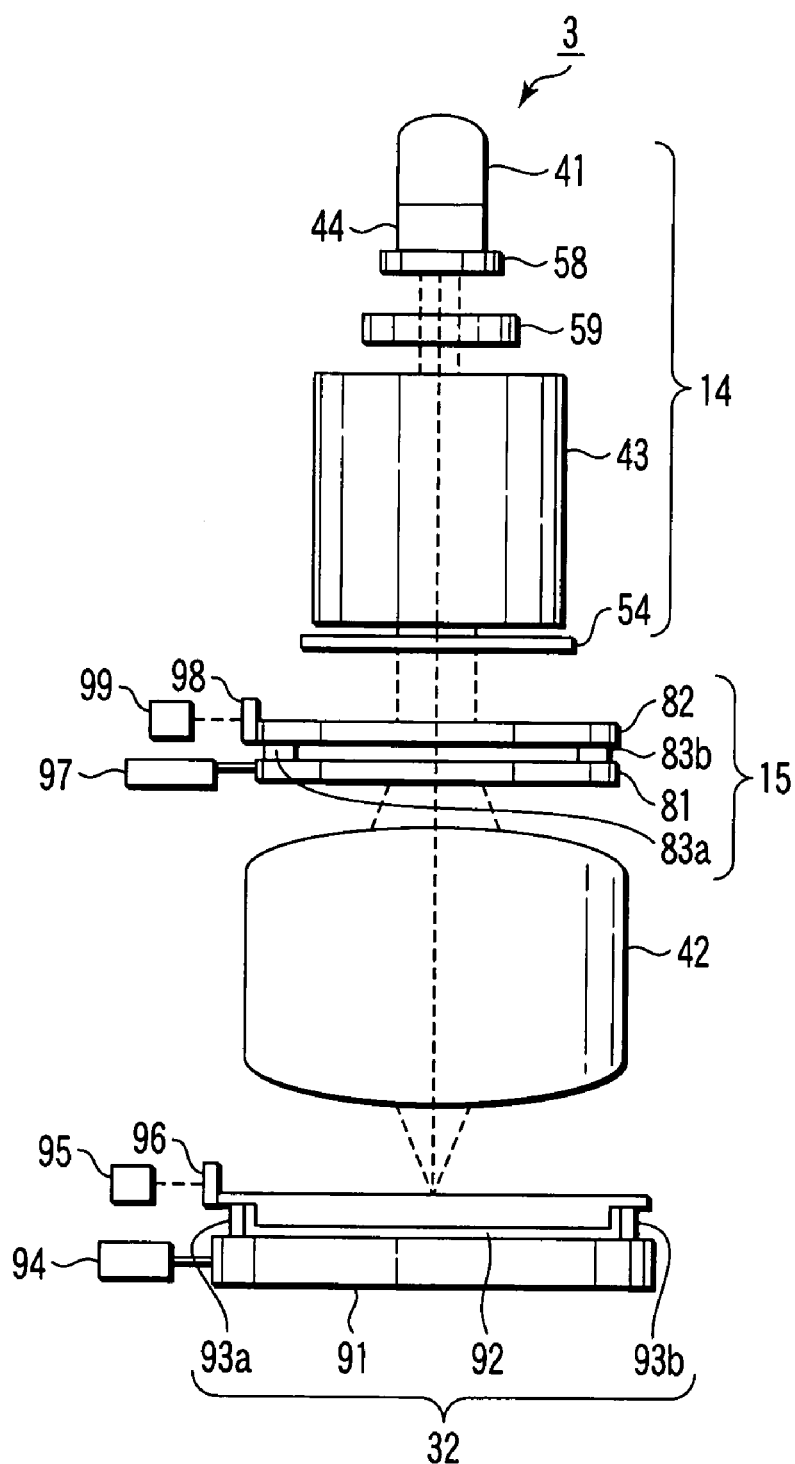
FIG. 2 is a first schematic view of an exposure apparatus subjected to the light intensity distribution simulation system according to the first embodiment of the invention.

The light intensity calculator unit 351a calculates a distribution of the diffraction lights generated in the apertures of the pattern using the effective shape calculated for every point light source, assuming the film thickness of the pattern film is zero One example of the exposure apparatus which is subjected to the light intensity distribution simulation by the light intensity distribution simulation system is shown in FIG. 2.

The exposure apparatus comprises an illumination optical system 14, a reticle stage 15 arranged below the illumination optical system 14, a projection optical system 42 arranged below the reticle stage 15, and a wafer stage 32 arranged below the projection optical system 42.

The illumination optical system 14 comprises an illumination light source 41 for irradiating the light of a wavelength λ, an integrator 44 arranged under the illumination light source 41, an aperture diaphragm holder 58 arranged under the integrator 44, a polarizer 59 for polarizing the light emitted from the illumination light source 41, a concentration optical system 43 for concentrating light, and a slit holder 54 arranged under the concentration optical system 43. Here, the integrator 44 is also called fly-eye lens and includes a plurality of lens elements. The light emitted from the integrator 44 forms the effective light source.

The reticle stage 15 comprises a reticle XY stage 81, reticle movable shafts 83a and 83b provided on the reticle XY stage 81 and a reticle Z-tilting stage 82 connected to the reticle XY stage 81 by the reticle movable shafts 83a and 83b.

A reticle stage driving unit 97 is connected to the reticle stage 15. The reticle stage driving unit 97 scans the reticle XY stage 81 in a horizontal direction. The reticle stage driving unit 97 drives the reticle movable shafts 83a and 83b in a vertical direction. Therefore, the reticle Z-tilting stage 82 can be positioned in the horizontal direction by the reticle XY stage 81. Further, the reticle Z-tilting stage 82 may be tilted on a horizontal surface by the reticle movable shafts 83a and 83b. A reticle movable mirror 98 is positioned at the end of the reticle Z-tilting stage 82. The position of the reticle Z-tilting stage 82 is measured by a reticle laser interferometer 99 which is arranged opposite to the reticle movable mirror 98.

The wafer stage 32 comprises a wafer XY stage 91, wafer movable shafts 93a and 93b arranged on the wafer XY stage 91, and a wafer Z-tilting stage 92 connected to the wafer XY stage 91 by the wafer movable shafts 93a and 93b. A wafer stage driving unit 94 is connected to the wafer stage 32. The wafer stage driving unit 94 scans the wafer XY stage 91 in the horizontal direction. The wafer stage driving unit 94 drives the wafer movable shafts 93a and 93b in the vertical direction. Therefore, the wafer Z-tilting stage 92 is positioned in the horizontal direction by the wafer XY stage 91. The wafer Z-tilting stage 92 may be tilted on the horizontal surface by the wafer movable shafts 93a and 93b. A wafer movable mirror 96 is positioned at the end of the wafer Z-tilting stage 92. The position of the wafer Z-tilting stage 92 is measured by a wafer laser interferometer 95 which is arranged opposite to the wafer movable mirror 96.

Figure 3:
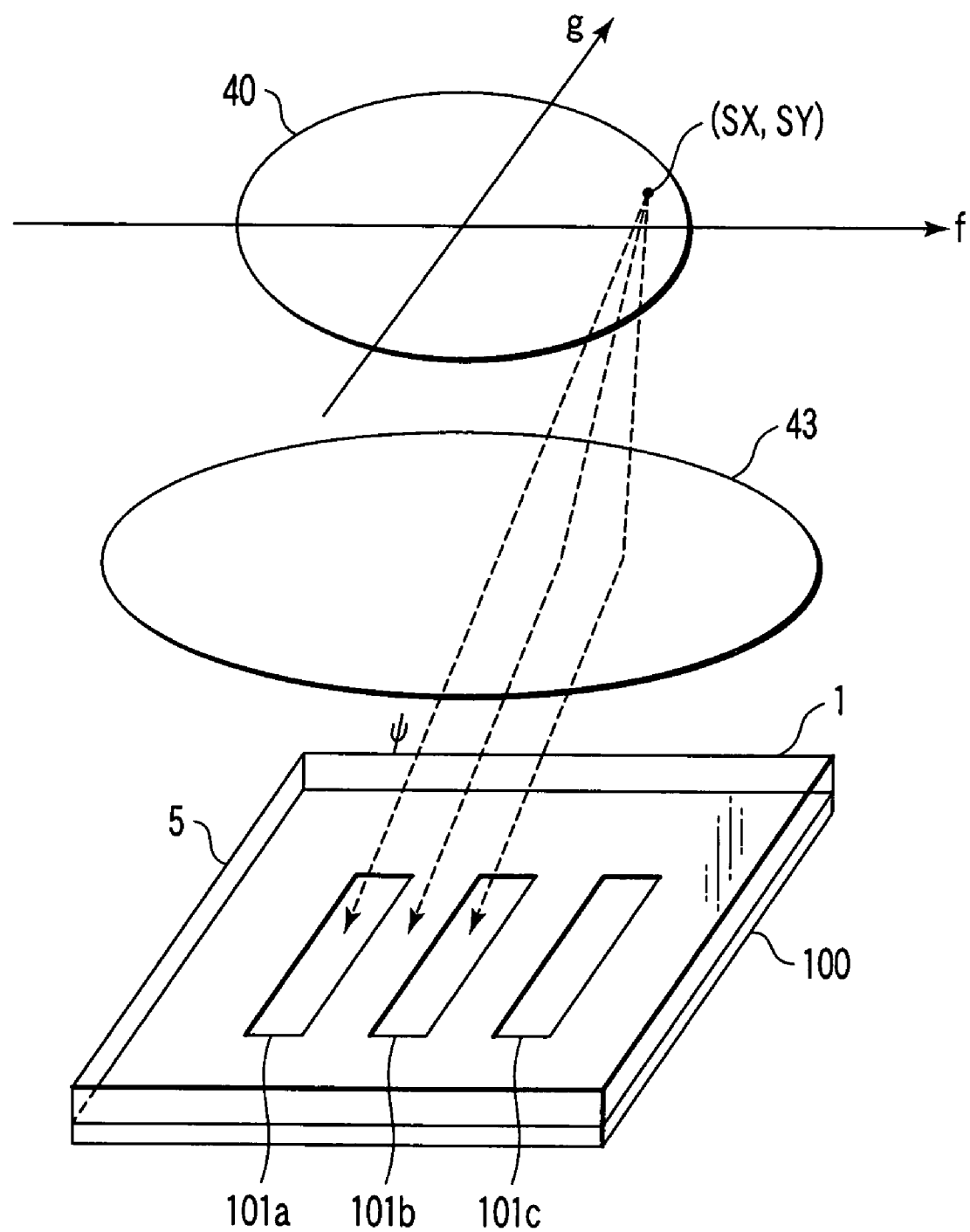
FIG. 3 is a second schematic view of an exposure apparatus subjected to the light intensity distribution simulation system according to the first embodiment of the invention.

A photomask 5 to be irradiated with light is disposed on the reticle stage 15. FIG. 3 schematically shows the state in which light ψ emitted from a point light source (SX, SY) that is a part of an effective light source 40 formed by the light emitted from the integrator 44 is concentrated by the concentration optical system 43 and the concentrated light ψ enters in the photomask 5.

Figure 4:
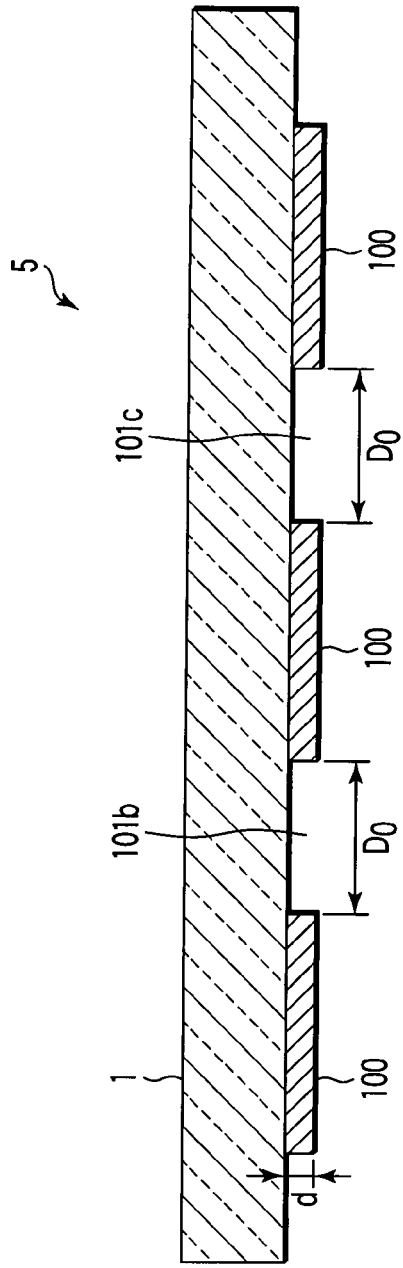
FIG. 4 is a first cross-sectional view of a photomask subjected to the light intensity distribution simulation system according to the first embodiment of the invention.

As shown in a cross-sectional view of FIG. 4, the photomask 5 comprises a transparent substrate 1 formed of a quartz glass and the like, and a pattern film 100 arranged on a rear surface of the transparent substrate 1. As shown in FIGS. 3 and 4, the pattern film 100 includes apertures 101a, 101b, and 101c having a designed aperture size $D_0$. The surface of the transparent substrate 1 is exposed in the apertures 101a to 101c. As a material of the pattern film 100, chromic oxide (CrxOy), chromic fluoride (CrF), molybdenum silicide (MoSi) and the like can be used. Each refractive index n of CrxOy, CrF, and MoSi is about 2.2. Here, a phase difference φ between the light which passes through the pattern film 100 and the light which proceeds in the air, emitted from the transparent substrate 1 is obtained by the following formula (1).

$$\Phi = 2\pi \{n \times d/\lambda - n_0 \times d/\lambda\} \quad (1)$$

In the formula (1), n shows the refractive index of the pattern film 100, $n_0$ shows the refractive index of the air, and d shows the film thickness of the pattern film 100.

When the refractive index $n_0$ is 1.0 and the wavelength λ of the light is 193 nm, the film thickness d of the pattern film 100 necessary to make the phase difference φ at the angle of 180 degrees is 80 nm.

Even when the photomask 5 is not a halftone mask and the pattern film 100 is formed by chrome (Cr), the film thickness d has to be 80 nm.

Hereinafter, in order to simplify the description, it is assumed that the pattern film 100 is formed by a light-shielding material such as Cr.

Figure 5:
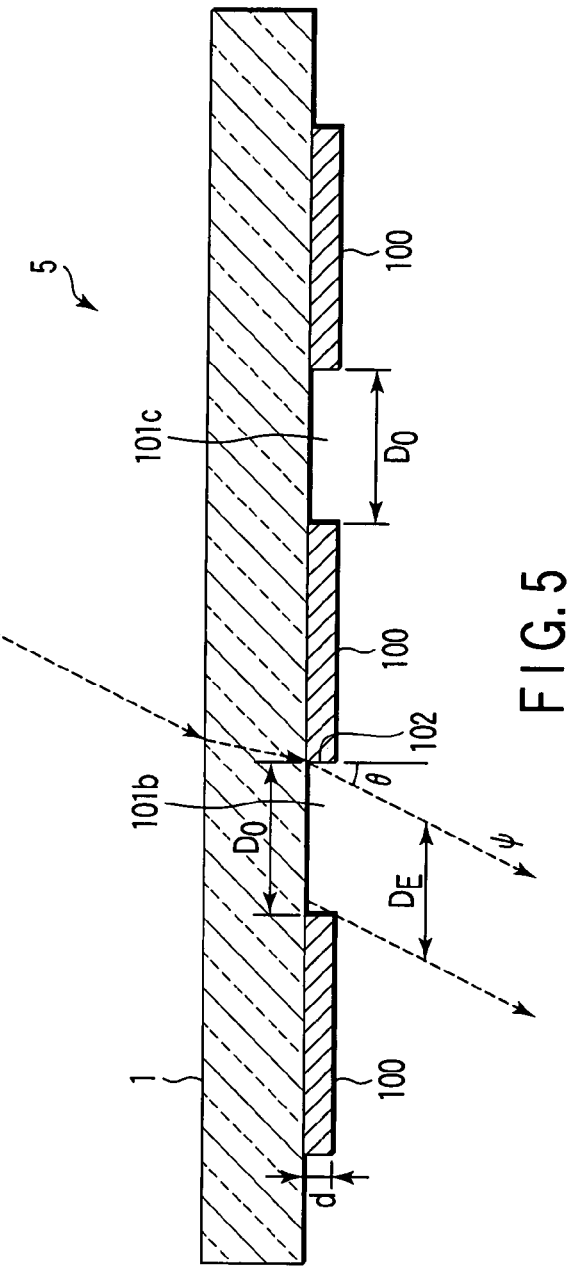
FIG. 5 is a second cross-sectional view of a photomask subjected to the light intensity distribution simulation system according to the first embodiment of the invention.

Here, it is assumed that the light ψ emitted from the illumination light source 41 shown in FIG. 2 enters obliquely in the transparent substrate 1 of the photomask 5 at incident angle of the light ψ emitted from each of the point light sources defined at each position of the point light sources as shown in FIG. 5, and the obliquely entered light ψ proceeds into the air from the transparent substrate 1 at the refracting angle θ.

In this case, although the aperture 101a actually has the designed aperture size $D_0$, an effective aperture size $D_E$ becomes smaller than the designed aperture size $D_0$ with respect to the oblique incident light ψ.

The effective aperture size $D_E$ is obtained by the following formula (2).

Here, the ratio of the effective aperture size $D_E$ and the designed aperture size $D_0$ shown in the following formula (3) is defined as an aperture size ratio O.R.

$$D_E = D_0 - d \tan \theta \quad (2)$$

$$O.R. = D_E/D_0 = 1 - d \tan \theta / D_0 \quad (3)$$

The value of refracting angle θ shown in FIG. 5 changes according to a numerical aperture NA and a coherence factor σ of the optical system of the exposure apparatus shown in FIG. 2. In addition, as the miniaturization of the mask pattern of the photomask 5 proceeds, the maximum value θmax of the refracting angle θ tends to become larger. The relation among the maximum refracting angle θmax, the numerical aperture NA, and the coherence factor σ is obtained by the following formula (4) with an inverse number Mag of a demagnification factor of the projection optical system 42.

$$\theta max = \arcsin(\sigma NA/Mag) \quad (4)$$

For example, when the coherence factor σ is 0.95, the numerical aperture NA is 1.05, and the inverse number Mag of the demagnification factor is 4, the maximum refracting angle θmax is 14.4 degrees. Further, when the film thickness d of the pattern film 100 is 80 nm and the designed aperture size $D_0$ is 260 nm, the opening size ratio O.R. is 0.92 according to the formula (3). Such the variation of the aperture size has effect on the diffraction light generated in the photomask, and the influence will be described below.

Figure 6:
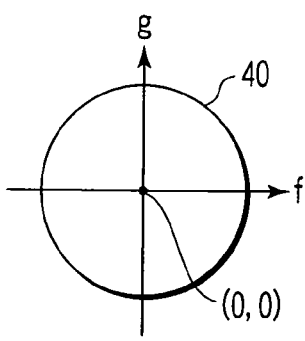
FIG. 6 is a first schematic view of an effective light source subjected to the light intensity distribution simulation system according to the first embodiment of the invention.
Figure 7:
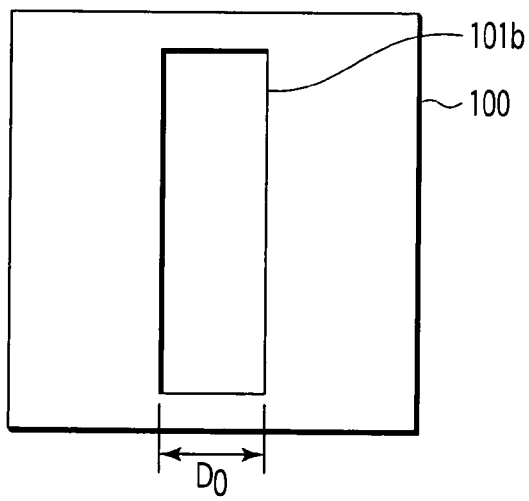
FIG. 7 is a first schematic view of an aperture of the photomask subjected to the light intensity distribution simulation system according to the first embodiment of the invention.
Figure 8:
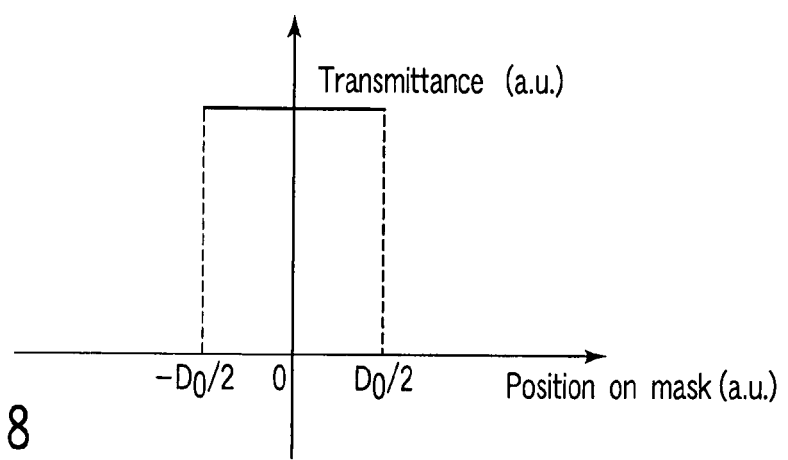
FIG. 8 is a first graph of transmittance of the photomask subjected to the light intensity distribution simulation system according to the first embodiment of the invention.

At first, as shown in FIG. 6, the film thickness d of the pattern film 100 does not have the effect on the diffraction light, with respect to the light which is emitted from a point light source (0, 0) positioning at the center of the effective light source 40 and enters in the photomask 5 vertically. Therefore, the designed aperture size $D_0$ of the aperture 101b shown in the top view of FIG. 7 is equal to the effective aperture size $D_E$ and a first transmittance distribution $T_p(X)$ in the vicinity of the aperture 101b can be expressed by a first rectangle (rect) function obtained by the following formula (5) as shown in FIG. 8.

$$T_p(X) = rect(x/D_0) \quad (5)$$

In this case, ν is put as frequency and a first amplitude intensity distribution $E_{D1}(\nu)$ of the diffraction light generated in the aperture 101b is expressed in a first sync (sinc) function obtained by the following formula (6) in which the first rect function obtained by the formula (5) is Fourier transformed.

$$E_{D1}(v) = \int rect(x/D_0)\exp(2\pi i x v) dx \qquad (6)$$
$$= D_0 \times \sin(\pi D_0 v)/(\pi D_0 v)$$
$$= D_0 \times \mathrm{sinc}(\pi D_0 v)$$

Where, i shows an imaginary number.

Figure 9:
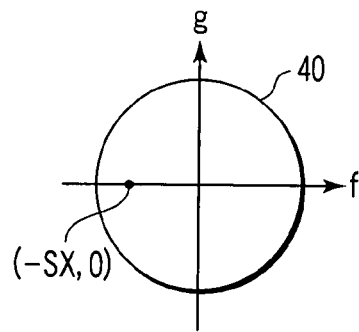
FIG. 9 is a second schematic view of the effective light source subjected to the light intensity distribution simulation system according to the first embodiment of the invention.
Figure 10:
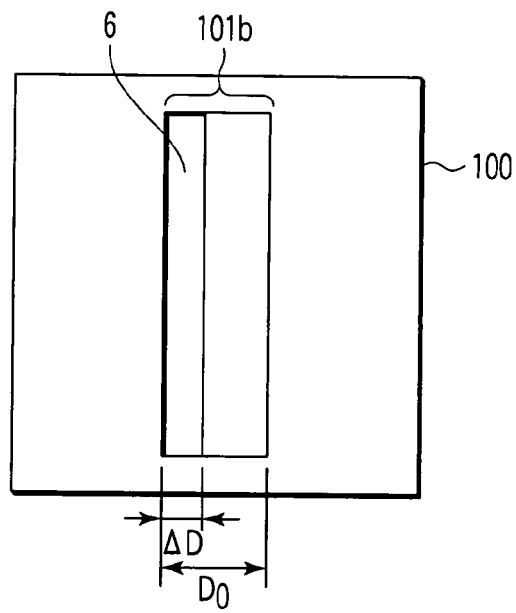
FIG. 10 is a second schematic view of the aperture of the photomask subjected to the light intensity distribution simulation system according to the first embodiment of the invention.

Contrarily, as shown in FIG. 9, the light which is emitted from a point light source (−SX, 0) that is a part of the effective light source 40 and enters obliquely in the photomask 5 cannot illuminate the whole aperture 101b due to the side wall 102 of the pattern film 100 having the film thickness d and a shadow occurs in the aperture 101b. Therefore, the two-dimensional effective aperture size $D_E$ Of the aperture 101b shown in the top view of FIG. 10 becomes smaller than the designed aperture size $D_0$.

Here, when the incident vector υ of the light entering in the photomask 5 from a point light source (SX, SY) forming the effective light source 40 is obtained by the following formulas (7) to (9), the diffraction phenomenon generated in the aperture 101b may be approximated to the diffraction phenomenon generated in the case where a virtual aperture having the film thickness d of 0 and the effective aperture size $D_E$ obtained by the following formula (10) is provided in the pattern film 100 instead of the aperture 101b.

$$\upsilon = (SX, SY, (1-SX^2-SY^2)^{1/2}) \qquad (7)$$

$$|\upsilon| = 1 \qquad (8)$$

$$SX^2 + SX^2 + SY^2 \leq 1 \qquad (9)$$

$$D_E = D_0 - d\tan(\arcsin(SX)) = D_0 - \Delta D \qquad (10)$$

Figure 11:
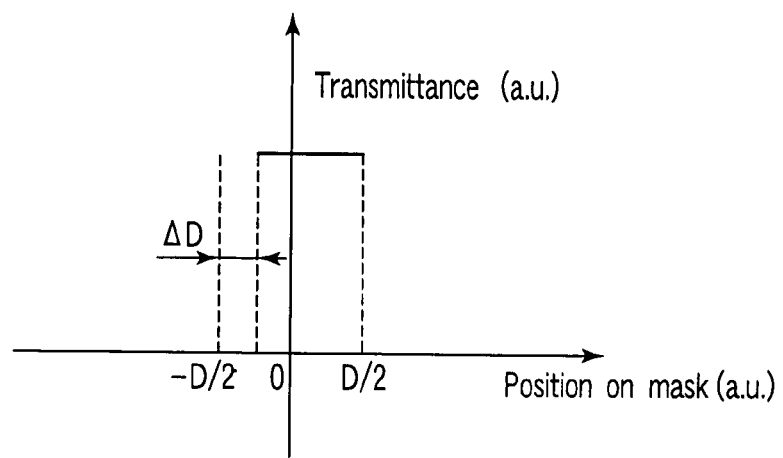
FIG. 11 is a second graph showing transmittance of the photomask subjected to the light intensity distribution simulation system according to the first embodiment of the invention.

Therefore, a second transmittance distribution $T_0(X)$ in the vicinity of the aperture 101b when the light enters obliquely in the photomask 5 can be shown by a second rectangle (rect) function obtained by the following formula (11), as shown in FIG. 11.

$$T_0(X) = rect\{(x - \Delta D/2)/D_E\} \qquad (11)$$
$$= rect\{(x - \Delta D/2)/(D_0 - \Delta D)\}$$

In this case, a second amplitude intensity distribution $E_{D2}(v)$ of the diffraction light generated in the aperture 101b is shown by a second sinc function obtained by the following formula (12) in which a second rect function obtained by the formula (11) is Fourier transformed.

$$E_{D2}(v) = (D_0 - \Delta D)\mathrm{sinc}\{(D_0 - \Delta D)v\}\exp\{2\pi i(\Delta D/2)v\} \qquad (12)$$

As shown in the formula (12), the second sinc function includes the imaginary part $\exp\{2\pi i(\Delta D/2)v\}$.

Figure 12:
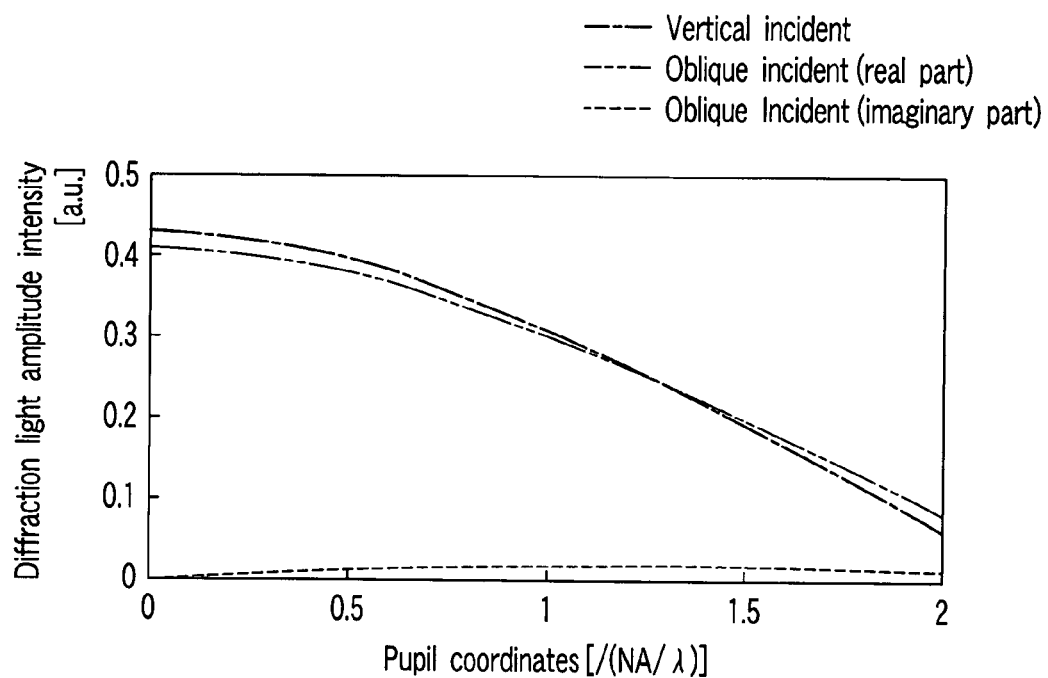
FIG. 12 is a first graph showing diffraction light amplitude intensity according to the first embodiment of the invention.
Figure 13:
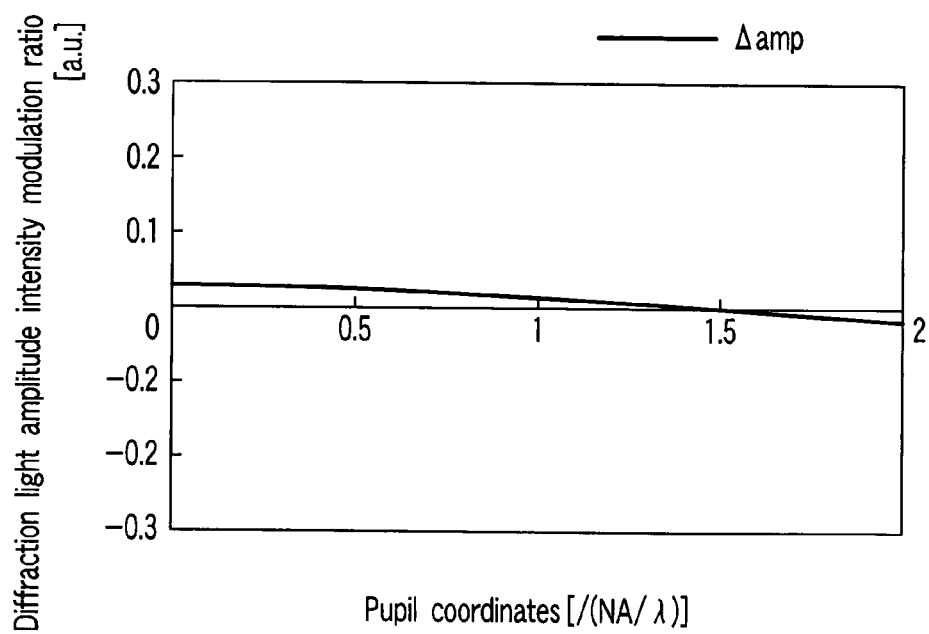
FIG. 13 is a first graph showing diffraction light amplitude intensity modulation ratio according to the first embodiment of the invention.

Therefore, when the light enters in the photomask 5 obliquely, the amplitude intensity of the diffraction light is separated into a real part Re and an imaginary part Im as shown in FIG. 12, further, the diffraction light receives an amplitude modulation Δamp obtained by the following formula (13), as shown in FIG. 13.

Figure 14:
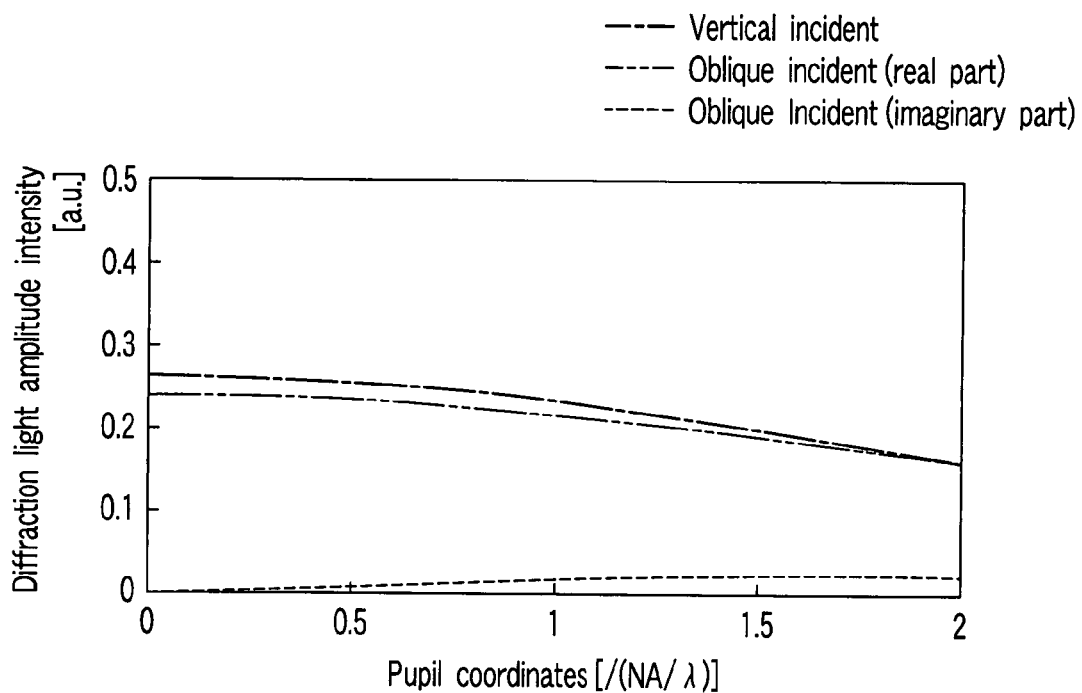
FIG. 14 is a second graph showing the diffraction light amplitude intensity according to the first embodiment of the invention.
Figure 15:
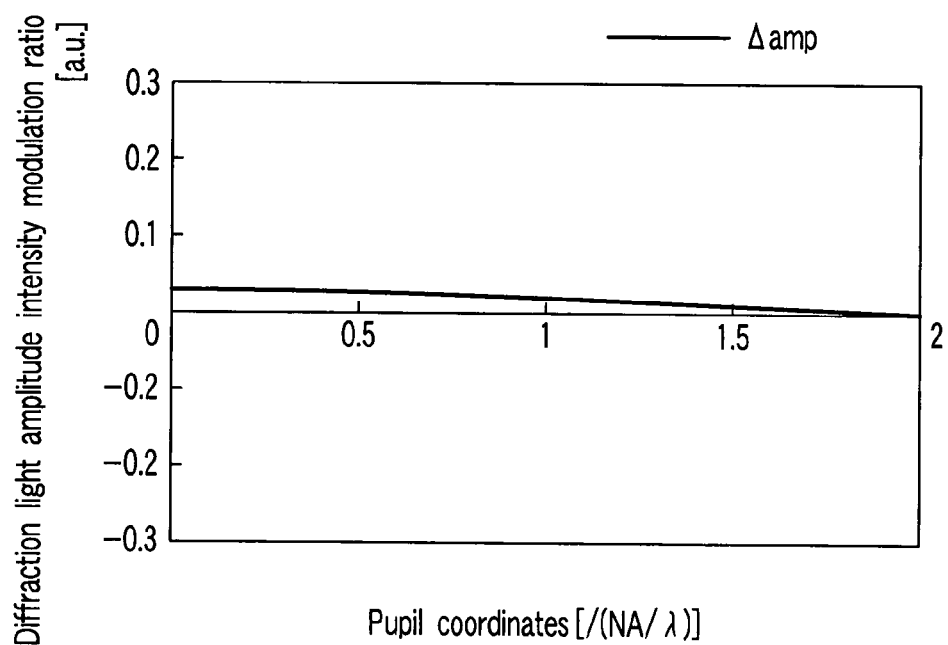
FIG. 15 is a second graph showing the diffraction light amplitude intensity modulation ratio according to the first embodiment of the invention.

In addition, FIGS. 12 and 13 show the case where the wavelength λ of the light is 193 nm, the numerical aperture NA is 0.92, the coherence factor σ is 0.95, the film thickness d is 80 nm, the designed aperture size $D_0$ is 360 nm, and the aperture 101b is reduced by 1/4 and projected. The amplitude intensity of the diffraction light when the designed aperture size $D_0$ is 220 nm under the same exposure condition is shown in FIG. 14 and the modulation ratio of the amplitude intensity of the diffraction light is shown in FIG. 15.

$$\Delta amp = |E_{D1}| - (Re^2 + Im^2)^{1/2} \qquad (13)$$

Here, a fluctuation estimating unit 307 included in the CPU 300a shown in FIG. 1 calculates each opening size ratio O.R. of the apertures 101a to 101c by using the formula (3) when the photomask 5 shown in FIGS. 3 to 5 is put on the exposure apparatus shown in FIG. 2.

The fluctuation estimating unit 307 shown in FIG. 1 determines whether the opening size ratio O.R. calculated is 0.95 or less which is an example of an allowance value.

In addition, when a plurality of apertures are provided in the photomask 5, it may determine whether the opening size ratio O.R. of the minimum aperture is not more than the allowance value.

The incident vector calculator unit 308 divides the effective light source 40 and extracts a plurality of point light sources (SX, SY). Further, the incident vector calculator unit 308 calculates the incident vector υ of the light which is emitted from the point light source (SX, SY) shown in FIG. 16 and enters obliquely in the photomask 5 shown in FIG. 5, obtained by the formulas (7) to (9).

The effective shape calculator unit 309 shown in FIG. 1 calculates a plurality of effective shapes of the aperture 101b corresponding to the respective point light sources. More specifically, the effective shape calculator unit 309 calculates a movement vector V of the light obtained by the following formula (14) on a plane parallel to the pattern film 100 when the light proceeds the same distance as the film thickness d of the pattern film 100 in the direction vertical to the photomask 5 according to the incident vector υ.

$$V = (-d\tan(\arcsin(SX)), -d\tan(\arcsin(SY))) \qquad (14)$$

Figure 18:
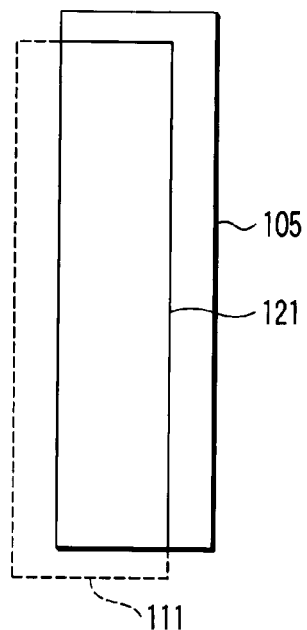
FIG. 18 is schematic view of effective shape of the aperture subjected to the light intensity distribution simulation system according to the first embodiment of the invention.

Here, as shown in FIG. 17, the effective shape calculator unit 309 calculates a dummy pattern aperture 111 obtained by parallel moving the design shape 105 of the aperture 101b according to the movement vector V obtained by the formula (11). Further, the effective shape calculator unit 309 obtains logical multiplication (AND) of the design shape 105 and the dummy pattern aperture 111, and calculates the effective shape 121 as shown in FIG. 18. When a set of coordinates forming the design shape 105 is shown by A (x, y) and a set of coordinates forming the dummy pattern aperture 111 is shown by A (x+d tan(arcsin (SX)), y+d tan(arcsin (SY))), a set Aeff (x, y) of coordinates forming the effective shape 121 is obtained by the following formula (15).

$$A_{\mathit{eff}}(x,y) = A(x,y) \cap A(x+d\tan(\arcsin(SX)), y+d\tan(\arcsin(SY))) \qquad (15)$$

In the above example, although the case of calculating the effective shape 121 from the aperture 101b has been shown, the effective shape calculator unit 309 shown in FIG. 1 calculates a plurality of effective shapes corresponding to a plurality of point light sources respectively in respect to the other apertures 101a and 101c, etc included in the photomask 5.

Assuming that there is no film thickness in the pattern film 100, the intensity calculator unit 351a calculates the light intensity distribution of a projected image of a mask pattern of the photomask 5 imaged on a semiconductor substrate which is disposed on the wafer stage 32 shown in FIG. 2, by using the respective effective shapes of the apertures 101b corresponding to the respective point light sources. Here, a partial coherent imaging formula obtained by the following formula (16) or (17) is generally used for the light intensity distribution simulation.

$$I(x, y) = \qquad (16)$$
$$\int\int\int S(f,g)P(f+f_1, g+g_1)P*(f+f_2, g+g_2)\hat{m}(f1,g1)$$
$$\hat{m}*(f_2, g_2)\cdot$$
$$\exp(-2\pi i((f_1-f_2)x+(g_1-g_2)y))df_1dg_1df_2dg_{21}dfdg$$
$$=\int S(f,g)$$
$$\left|\int P(f+f_1, g+g_1)\hat{m}(f_1,g_1)\exp(-2\pi i(f_1x+g_1Y))df_1dg_1\right|^2$$
$$dfdg$$

$$I(x, y) = \qquad (17)$$
$$\int\left(\int\int TCC(f+f_1, g+g_1; f_1, g_1)\hat{m}(f+f_1, g+g_1)\hat{m}*(f_1,g_1)\right.$$
$$\left.df_1dg_1\right)\exp-(2\pi i(fx+gy)dfdg$$

In the formulas (16) and (17), S shows the intensity distribution of the effective light source, P shows a pupil function of the projection optical system 42, * shows a complex conjugate, m^ shows a Fourier transform of a complex transmission distribution of the mask pattern, and TCC shows a transfer function called transmittance cross coefficient.

According to the formula (16), among the light intensity distribution of the diffraction light generated in the mask pattern, the components which can pass through the pupil are calculated, further, the light amplitude distribution on the image surface is calculated by inverse Fourier transform, and intensity integration is performed according to the intensity distribution of the effective light source.

According to the formula (17), a previously calculated TCC and the diffraction light distribution generated in the mask pattern are double integrated and the light intensity distribution on the image surface is calculated.

By comparison between the formulas (16) and (17), the formula (16) performs a coherent imaging calculation on the light emitted from each point light source forming the effective light source 40. Therefore, when the light intensity distribution of the projection image is calculated by using the effective shapes of the aperture 101b corresponding to the respective point light sources, the formula (16) is better suited. However, the formula (16) uses an assumption that the intensity distribution of the diffraction light generated in the mask pattern does not depend on the point light source (f, g). Therefore, the light intensity calculator unit 351a shown in FIG. 1 calculates the light intensity distribution of the projection image by using the following formula (18) which is modification of the formula (16).

$$I(x,y)=\int S(f,g)|\int P(f+f_1,g+g_1)$$
$$\hat{m}(f_1,g_1;f,g)\exp(-2\pi i(f_1x+g_1y))df_1dg_1|^2dfdg \qquad (18)$$

A data storage device 320a is connected to the CPU 300a. The data storage device 320a comprises an exposure condition storage unit 302, a mask pattern storage unit 303, a division environment storage unit 305, and an effective shape storage unit 304.

The exposure condition storage unit 302 stores the exposure condition such as the numerical aperture NA of the projection optical system 42, the coherence factor σ, and an orbicular zone screen factor of the illumination light source 41 in the exposure apparatus shown in FIG. 2.

The mask pattern storage unit 303 shown in FIG. 1 stores the design data of the photomask 5 shown in FIGS. 3 to 5 disposed on the reticle stage 15 of the exposure apparatus shown in FIG. 2 in the form of CAD data or the like. The design data of the photomask 5 is related to the apertures 101a, 101b, and 101c and the film thickness d of the pattern film 100 or the like.

The division environment storage unit 305 shown in FIG. 1 stores the coordinates of a plurality of point light sources (SX, SY) calculated by the incident vector calculator unit 308 and the incident vectors U of the respective lights ψ irradiated from the point light sources (SX, SY).

The effective shape storage unit 304 stores the respective effective shapes of the apertures 101a to 101c calculated by the effective shape calculator unit 309.

An input unit 312, an output unit 313, a program memory 330, and a temporary memory 331 are connected to the CPU 300a.

As the input unit 312, a pointing device such as a keyboard and a mouse may be used.

An image display such as a liquid display and a monitor, and a printer may be used as the output unit 31.

The program memory 330 stores an operating system for controlling the CPU 300a.

The temporary memory 331 sequentially stores an operation result obtained by the CPU 300a.

As the program memory 330 and the temporary memory 331, a recording medium for recording a program, such as a semiconductor memory, a magnetic disk, an optical disk, an optical magnetic disk, and a magnetic tape may be used.

Next, a light intensity distribution simulation method according to the first embodiment will be described by using the flow chart shown in FIG. 19.

(a) In Step S50, the fluctuation estimating unit 307 shown in FIG. 1 reads out the exposure environment of the exposure apparatus shown in FIG. 2 from the exposure condition storage unit 302. In addition, the fluctuation estimating unit 307 shown in FIG. 1 reads out the design shape of the aperture 101b of the photomask 5 including the pattern film 100 having the film thickness d shown in FIGS. 3 to 5 and an disposed position of the aperture 101b when the photomask 5 is disposed on the reticle stage 15, from the mask pattern storage unit 303.

Next, the fluctuation estimating unit 307 shown in FIG. 1 calculates the opening size ratio O.R. of the respective apertures 101a to 101c by using the formula (3) when the photomask 5 shown in FIGS. 3 to 5 is arranged in the exposure apparatus shown in FIG. 2. In addition, the fluctuation estimating unit 307 shown in FIG. 1 determines whether the calculated opening size ratio O.R. is not more than the allowance value. When the calculated opening size ratio O.R. is not more than the allowance value, the process goes to Step S100. When the opening size ratio O.R. which is calculated is more than the acceptable value, the light intensity distribution simulation is performed by conventional method.

(b) In Step S100, the incident vector calculator unit 308 shown in FIG. 1 reads out the exposure environment such as the form of the effective light source 40 formed of the light emitted from the integrator 44 shown in FIG. 2, from the exposure condition storage unit 302.

Next, the incident vector calculator unit 308 shown in FIG. 1 divides the effective light source 40 and extracts the plurality of point light sources (SX, SY). In Step S101, the incident vector calculator unit 308 reads out the design shape of the aperture 101b of the photomask 5 including the pattern film 100 having the film thickness d shown in FIGS. 3 to 5 and the disposed position of the aperture 101b when the photomask 5 is disposed on the reticle stage 15, from the mask pattern storage unit 303.

The incident vector calculator unit 308 shown in FIG. 1 calculates the incident vector υ of the light ψ which is emitted from each of the plurality of point light sources (SX, SY) and enters in the photomask 5 as shown in FIG. 3. The incident vector υ is obtained by the formulas (7) to (9). The incident vector calculator unit 308 stores the coordinates of the plurality of point light sources (SX, SY) and the incident vector υ of the plurality of lights ψ irradiated from each of the plurality of point light sources (SX, SY) in the division environment storage unit 305.

(c) In Step S102, the effective shape calculator unit 309 reads out the coordinates of the plurality of point light sources (SX, SY) and the incident vector υ of the plurality of lights ψ irradiated from each of the plurality of point light sources (SX, SY), from the division environment storage unit 305.

Next, the effective shape calculator unit 309 calculates the movement vector V of the light ψ on the plane parallel with the pattern film 100 when the light ψ emitted from each of the plurality of point light sources (SX, SY) proceeds the same distance as the film thickness d of the pattern film 100 in the vertical direction to the photomask 5 shown in FIG. 5 according to the incident vector υ. The movement vector V is obtained by the formula (14).

(d) In Step S103, the effective shape calculator unit 309 calculates the dummy pattern aperture 111 obtained by shifting the design shape 105 of the aperture 101b in parallel according to the movement vector V obtained by the formula (11), as shown in FIG. 17. In Step S104, the effective shape calculator unit 309 obtains logical multiplication (AND) of the design shape 105 and the dummy pattern aperture 111, and calculates the effective shape 121, as shown in FIG. 18. The effective shape calculator unit 309 stores the calculated effective shape 121 in the effective shape storage unit 304.

(e) In Step S105, the light intensity calculator unit 351a reads out the effective shape 121 from the effective shape storage unit 304 and reads out the exposure environment of the exposure apparatus shown in FIG. 2 from the exposure condition storage unit 302. In addition, the light intensity calculator unit 351a shown in FIG. 1 reads out the design shape of the aperture 101b of the photomask 5 including the pattern film 100 shown in FIGS. 3 to 5 and the disposed position of the aperture 101b when the photomask 5 is disposed on the reticle stage 15 from the mask pattern storage unit 303.

Next, the light intensity calculator unit 351a substitutes the virtual aperture having the effective shape 121 for the aperture 101b having the design shape 105 of the photomask 5 and assumes that the film thickness d of the pattern film 100 is zero.

(f) In Step S106, the light intensity calculator unit 351a calculates distribution of diffraction light in the virtual aperture by using the formula (18). The diffraction light is generated by the light emitted from the point light sources (SX, SY) forming the effective light source 40 entering in the virtual aperture. Further, the light intensity calculator unit 351a calculates the light intensity distribution of the projection image of the mask pattern of the photomask 5 imaged on the semiconductor substrate arranged on the wafer stage 32 shown in FIG. 2. It also calculates the distribution of the diffraction light generated in the corresponding virtual aperture with respect to the other light emitted from each of the other point light sources (SX, SY), further calculates the light intensity distribution of the projection image. In this way, the light intensity distribution simulation method according to the first embodiment is finished.

Heretofore, in order to calculate the intensity distribution of the diffraction light generated in the aperture 101b included in the pattern film 100 having the film thickness d as shown in FIG. 5, an electromagnetic field on the transparent substrate 1 has been calculated exactly based on the film thickness d.

However, there is a problem that a finite difference time domain (FDTD) method takes a long time to calculate the electromagnetic field exactly and that a load of a computer is large. Therefore, it is difficult to feed back the intensity distribution of the calculated diffraction light to OPC.

Contrarily, according to the light intensity distribution simulation method of the first embodiment, the effective light source 40 is divided to extract a plurality of point light sources and a plurality of effective shapes of the apertures 101b corresponding to the point light sources (SX, SY) are calculated respectively.

Here, assuming that the film thickness d of the pattern film is zero, when the amplitude intensity of the diffraction light is calculated in every virtual aperture having each effective shape, the amplitude intensity of the calculated diffraction light reflects the area difference between the design shape and the effective shape caused by the film thickness d of the pattern film 100.

The step for calculating each of the plurality of effective shapes can be performed by graphics processing function of a computer. The load of the computer necessary for the graphics processing is much smaller than the load necessary to calculate the electromagnetic field exactly.

Therefore, according to the light intensity distribution simulation method of the first embodiment, an effect on the diffraction phenomenon by the film thickness d of the pattern film can be reflected easily in the calculation result of the light intensity distribution of the projection image. As a result, it is possible to feed back the light intensity distribution simulation result having a high accuracy to OPC more rapidly and to provide the mask pattern data having higher accuracy.

Further, OPC processed photomask with the calculation result fed back from the light intensity distribution simulation method according to the first embodiment may realize a good transfer reproducibility with a higher accuracy. As a result, it is possible to provide a semiconductor device with a high accuracy.

In addition, the light intensity distribution simulation method according to the first embodiment may be performed by extracting only the aperture having a smaller opening size ratio O.R. in the design rule checking step of the mask data processing.

SECOND EMBODIMENT

In a second embodiment, the effective shape calculator unit 309 included in the CPU 300a shown in FIG. 1 defines the vertexes of the design shape 105 of the aperture 101b shown in FIG. 20 as a1, a2, a3, and a4.

As shown in FIG. 21, the effective shape calculator unit 309 shown in FIG. 1 calculates a first side vector v1 connecting the second vertex a2 and the first vertex a1, a second side vector v2 connecting the third vertex a3 and the second vertex a2, a third side vector v3 connecting the fourth vertex a4 and the third vertex a3, and a fourth side vector v4 connecting the first vertex a1 and the fourth vertex a4.

Figure 22:
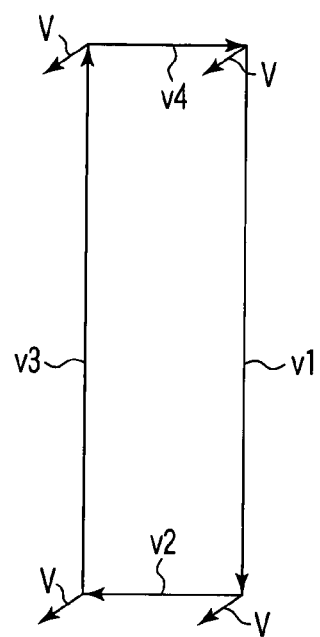
FIG. 22 is a second schematic view of the side vector forming the design shape of the aperture subjected to the light intensity distribution simulation system according to the second embodiment of the invention.
Figure 23:
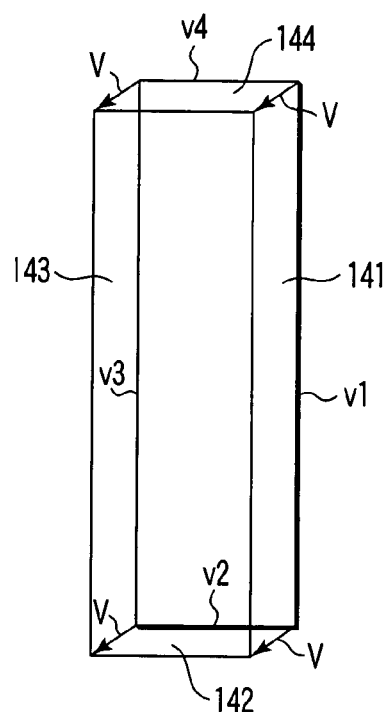
FIG. 23 is a schematic view of a shadow pattern generated in the aperture subjected to the light intensity distribution simulation system according to the second embodiment of the invention.

As shown in FIGS. 22 and 23, the effective shape calculator unit 309 shown in FIG. 1 calculates a first shadow pattern 141 which is formed by the first side vector v1 and the movement vector V obtained by the formula (14), a second shadow pattern 142 which is formed by the second side vector v2 and the movement vector V, a third shadow pattern 143 which is formed by the third side vector v3 and the movement vector V, and a fourth shadow pattern 144 which is formed by the fourth side vector v4 and the movement vector V.

The effective shape calculator unit 309 shown in FIG. 1 obtains logical addition (OR) of the first shadow pattern 141, the second shadow pattern 142, the third shadow pattern 143, and the fourth shadow pattern 144 shown in FIG. 23 to calculate a composite shadow pattern.

Figure 24:
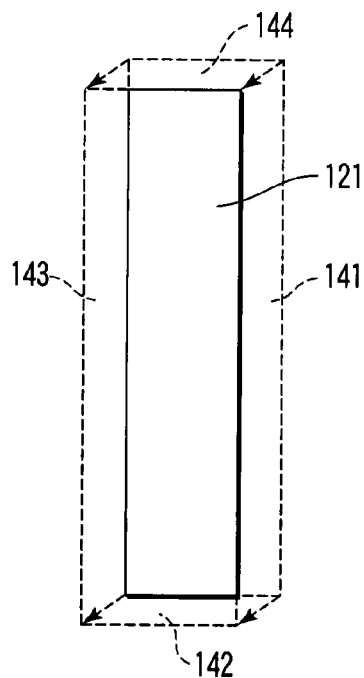
FIG. 24 is a schematic view of an effective shape of the aperture subjected to the light intensity distribution simulation system according to the second embodiment of the invention.

The effective shape calculator unit 309 shown in FIG. 1 obtains logical multiplication (AND) of negative (NOT) of the composite shadow pattern and the design shape 105 to calculate the effective shape 121 of the aperture 101b shown in FIG. 24.

The other modules of the light intensity distribution simulation system shown in FIG. 1 work in the same way as in the first embodiment, thereby omitting the description.

Next, a light intensity distribution simulation method according to the second embodiment will be described by using flow chart shown in FIG. 25.

Figure 19:
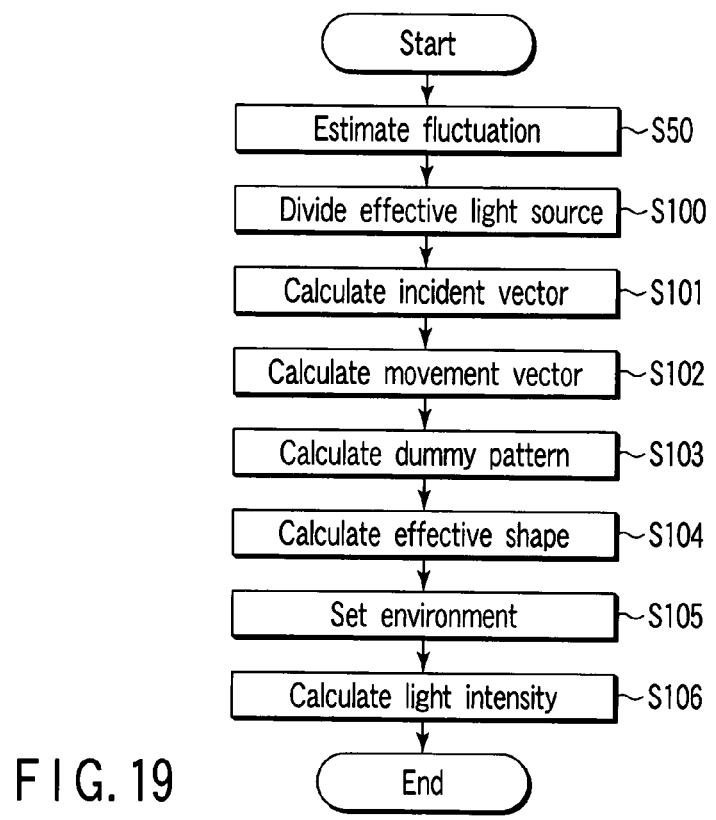
FIG. 19 is a flow chart showing a light intensity distribution simulation method according to the first embodiment of the invention.
Figure 25:
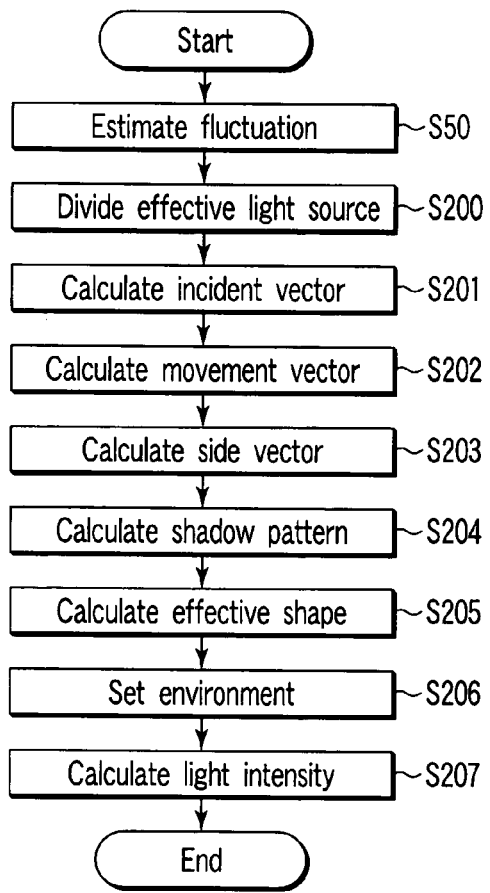
FIG. 25 is a flow chart showing a light intensity distribution simulation method according to the second embodiment of the invention.

(a) Step S50 and Step S200 to Step S202 shown in FIG. 25 are performed in the same way as Step S50 and Step S100 to Step S102 shown in FIG. 19.

In Step S203, the effective shape calculator unit 309 shown in FIG. 1 defines the vertexes of the design shape 105 of the aperture 101b shown in FIG. 20 as a1, a2, a3, and a4.

Next, as shown in FIG. 21, the effective shape calculator unit 309 calculates a first side vector v1 connecting the second vertex a2 and the first vertex a1, a second side vector v2 connecting the third vertex a3 and the second vertex a2, a third side vector v3 connecting the fourth vertex a4 and the third vertex a3, and a fourth side vector v4 connecting the first vertex a1 and the fourth vertex a4.

(b) In Step S204, as shown in FIG. 23, the effective shape calculator unit 309 shown in FIG. 1 calculates a first shadow pattern 141 which is formed by the first side vector v1 and the movement vector V, a second shadow pattern 142 which is formed by the second side vector v2 and the movement vector V, a third shadow pattern 143 which is formed by the third side vector v3 and the movement vector V, and a fourth shadow pattern 144 which is formed by the fourth side vector v4 and the movement vector V.

Thereafter, the effective shape calculator unit 309 shown in FIG. 1 obtains the logical addition (OR) of the first shadow pattern 141, the second shadow pattern 142, the third shadow pattern 143, and the fourth shadow pattern 144 shown in FIG. 23 to calculate the composite shadow pattern.

(c) In Step S205, the effective shape calculator unit 309 shown in FIG. 1 obtains the logical multiplication (AND) of the negative (NOT) of the composite shadow pattern and the design shape 105 to calculate the effective shape 121 of the aperture 101b shown in FIG. 24.

Next, the effective shape calculator unit 309 stores the calculated effective shape 121 in the effective shape storage unit 304.

Thereafter, Step S206 and Step S207 shown in FIG. 25 are performed in the same way as Step S105 and Step S106 shown in FIG. 19, and hence to complete the light intensity distribution simulation method according to the second embodiment.

The image processing for decomposing a polygon into vector sequence imposes a little load on the computer. Therefore, according to the light intensity distribution simulation method according to the second embodiment, it is also possible to reflect the effect on the diffraction phenomenon by the film thickness d of the pattern film in the calculation result easily and obtain the light intensity distribution simulation result with high accuracy in shorter time.

THIRD EMBODIMENT

Figure 26:
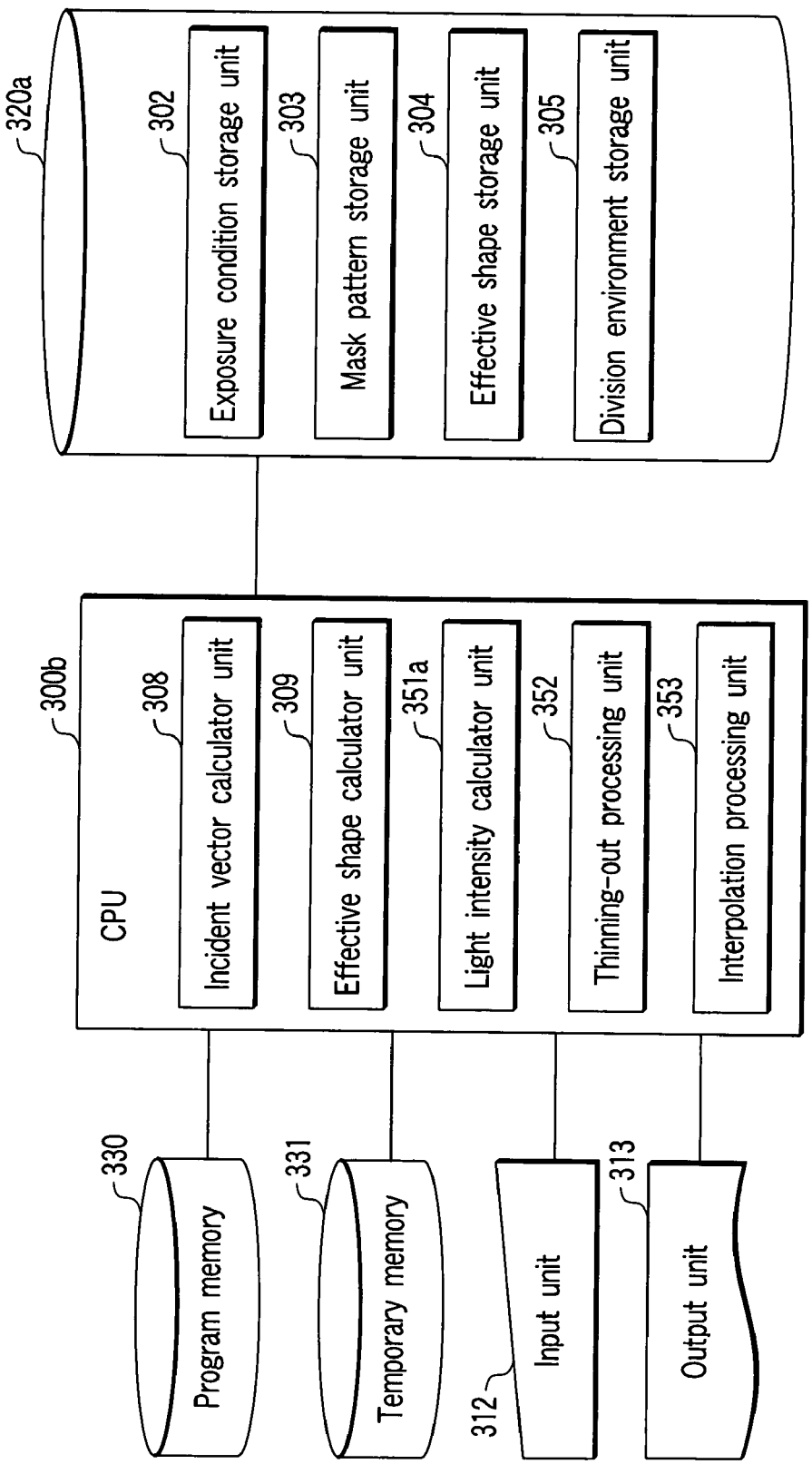
FIG. 26 is a block diagram showing a light intensity distribution simulation system according to a third embodiment of the invention.

A light intensity distribution simulation system according to a third embodiment shown in FIG. 26 is different from the light intensity distribution simulation system shown in FIG. 1 in that the CPU 300b further comprises a thinning-out processing unit 352 and an interpolation processing unit 353.

Figure 27:
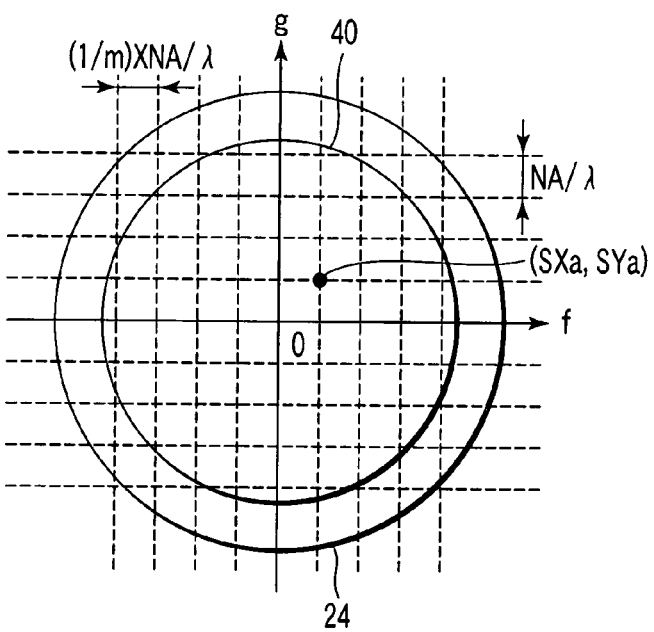
FIG. 27 is a first schematic view of an effective light source subjected to the light intensity distribution simulation system according to the third embodiment of the invention.

As shown in FIG. 27, the thinning-out processing unit 352 sets a grid of the space $(1/m) \times NA/\lambda$ on the pupil surface of an incident pupil 24 in the effective light source 40. The thinning-out processing unit 352 performs the thinning-out processing for extracting each portion of the effective light source 40 corresponding to each intersection of the grid as a selected point light source (SXa, SYa). Therefore, in the third embodiment, the effective shape calculator unit 309 shown in FIG. 26 calculates each extracted effective shape of aperture corresponding to each selected point light source (SXa, SYa).

The interpolation processing unit 353 calculates effective shapes of apertures corresponding to unselected point light sources (SXc, SYc) thinned out by the thinning-out processing unit 352, of the point light sources (SX, SY) forming the effective light source 40, based on effective shapes of the apertures corresponding to the selected point light sources (SXa, SYa) by interpolation method.

Next, a light intensity distribution simulation method according to the third embodiment will be described by using the flow chart shown in FIG. 28.

Figure 28:
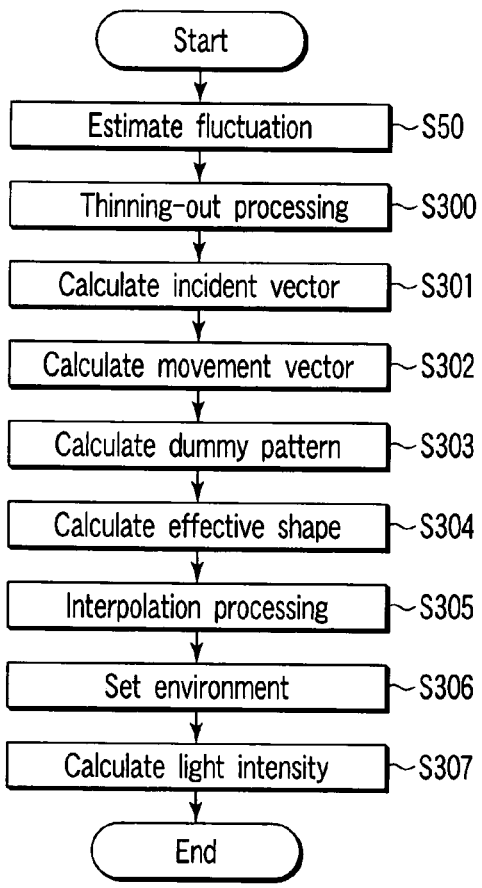
FIG. 28 is a flow chart showing a light intensity distribution simulation method according to the third embodiment of the invention.

(a) Step S50 shown in FIG. 28 is performed in the same way as Step S50 shown in FIG. 19.

In Step S300, the thinning-out processing unit 352 shown in FIG. 26 reads out the form of the effective light source 40 shown in FIG. 2 from the exposure condition storage unit 302.

Next, the thinning-out processing unit 352 sets the grid of the space $(1/m) \times NA/\lambda$ in the effective light source 40 as shown in FIG. 27.

Thereafter, the thinning-out processing unit 352 extracts each portion of the effective light source corresponding to each intersection of the grid as the selected point light source (SXa, SYa).

(b) In Step S301, as shown in FIG. 3, the incident vector calculator unit 308 shown in FIG. 26 calculates the incident vector υ of the light ψ which is emitted from each of the plurality of selected point light sources (SXa, SYa) and enters in the photomask 5. The incident vector υ is obtained by the formulas (7) to (9).

The incident vector calculator unit 308 stores the coordinates of the plurality of selected point light sources (SXa, SYa) and the incident vectors υ of the plurality of lights ψ emitted from the plurality of selected point light sources (SXa, SYa), in the division environment storage unit 305.

(c) In Step S302, the effective shape calculator unit 309 reads out the respective coordinates of the plurality of selected point light sources (SXa, SYa) and the incident vectors υ of the plurality of lights ψ emitted from the plurality of selected point light sources (SXa, SYa), from the division environment storage unit 305.

Next, the effective shape calculator unit 309 calculates the movement vector V of the light ψ on the plane parallel to the pattern film 100 when the light ψ emitted from each of the plurality of selected point light sources (SXa, SYa) proceeds the same distance as the film thickness d of the pattern film 100 according to the incident vector υ in the horizontal direction of the photomask 5 shown in FIG. 5. The movement vector V is obtained by the formula (14).

(d) Step S303 and Step S304 shown in FIG. 28 are performed in the same way as Step S103 and Step S104 shown in FIG. 19.

In Step S305, the interpolation processing unit 353 shown in FIG. 26 reads out the effective shape of the aperture 101b corresponding to each of the plurality of selected point light sources (SXa, SYa) from the effective shape storage unit 304.

Next, the interpolation processing unit 353 calculates effective shapes of apertures corresponding to the unselected point light sources (SXc, SYc) thinned out by thinning-out processing unit 352, of the plurality of point light sources (SX, SY) forming the effective light source 40, based on the effective shapes of the apertures corresponding to the of selected point light sources (SXa, SYa) by interpolation method.

The interpolation processing unit 353 stores the calculated effective shapes in the effective shape storage unit 304.

Thereafter, Step S306 and Step S307 shown in FIG. 28 are performed in the same way as Step S105 and Step S106 shown in FIG. 19, and hence to complete the light intensity distribution simulation method according to the third embodiment.

According to the light intensity distribution simulation method according to the third embodiment described above, it is possible to reduce the load on the computer necessary for performing Steps S301 to S304 as the thinning-out processing of Step S300 is performed. Therefore, it is possible to shorten a calculation time necessary for performing the simulation. Further, according to the embodiment, it is possible to keep the accuracy of the calculated light intensity as the interpolation processing is performed in Step S305.

Figure 29:
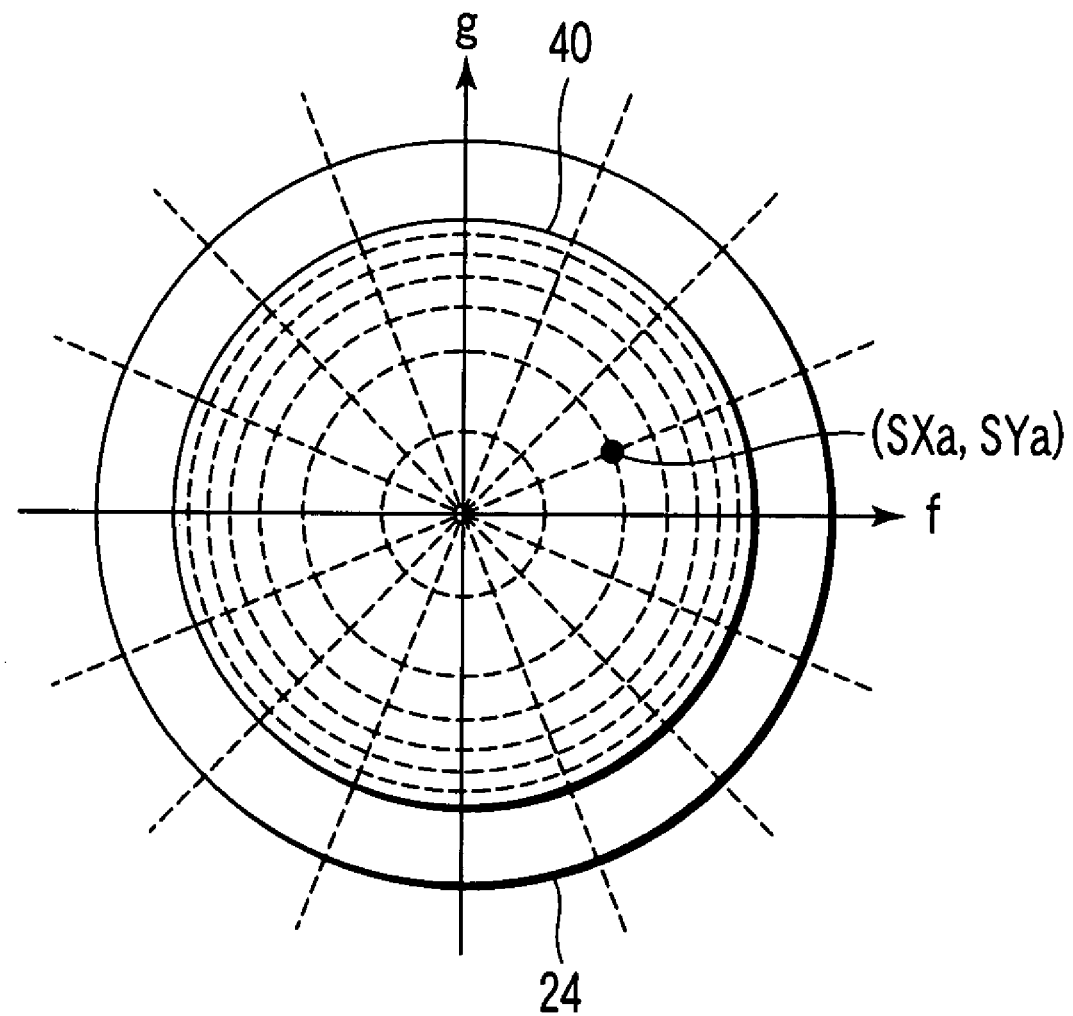
FIG. 29 is a second schematic view of the effective light source subjected to the light intensity distribution simulation system according to the third embodiment of the invention.

In addition, the method of extracting the plurality of selected point light sources (SXa, SYa) performed by the thinning-out processing unit 352 shown in FIG. 26 is not limited to the example shown in FIG. 27. Since the light emitted from the outer portion of the center of the effective light source 40 is more affected by the film thickness d of the pattern film 100 shown in FIG. 5. Therefore, for example, as shown in FIG. 29, the select point light sources (SXa, SYa) arranged in a manner that the intervals of the select point light sources (SXa, SYa) reduce toward an edge of an optical axis of the effective light source having diameter of a NA/λ on the incident pupil 24 from a center of the optical axis. In addition, the number of the selected point light sources extracted by the thinning-out processing unit 352 may be set so that the opening size ratio O.R. may be a predetermined value or more.

FOURTH EMBODIMENT

Figure 30:
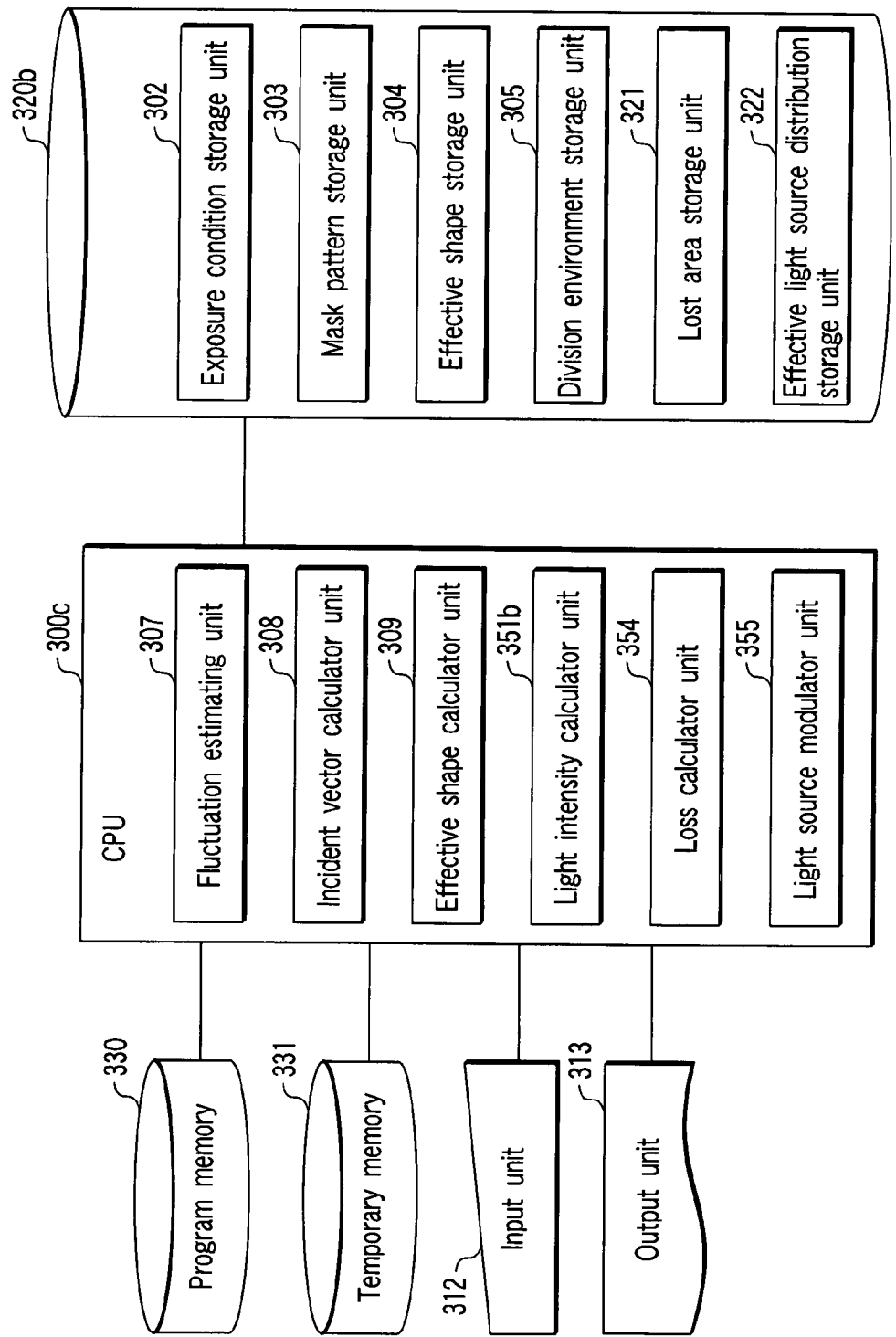
FIG. 30 is a block diagram showing a light intensity distribution simulation system according to a fourth embodiment of the invention.

A light intensity simulation system according to the fourth embodiment is different from the light intensity simulation system shown in FIG. 1 in that the CPU 300c further comprises a loss calculator 354 and a light source modulator unit 355, as shown in FIG. 30.

The loss calculator 354 calculates a lost area for each of the plurality of point light sources (SX, SY), in which the lost area is obtained by eliminating the effective shape from the design shape.

The light source modulator unit 355 calculates the modulated intensity distribution Sm (f, g) of the effective light source by applying the modulation to the light intensity of the light emitted from each of the plurality of point light sources (SX, SY) based on the lost area.

Here, a first amplitude intensity distribution $E_{D1}(v)$ of the diffraction light generated in the aperture by the light emitted from the point light source (0, 0) of the center of the effective light source 40 shown in FIG. 3 is obtained by the formula (6). A second amplitude intensity distribution $E_{D2}(v)$ of the diffraction light generated in the aperture by the light emitted from the point light source (−SX, 0) of the effective light source 40 is obtained by the formula (12). Therefore, when the coherency of the light emitted from the illumination light source 41 is not perfect, the relation between the second amplitude intensity distribution $E_{D2}(v)$ and the first amplitude intensity distribution $E_{D1}(v)$ may be approximated by the following formula (19). Therefore, the intensity of the light emitted from the point light source (SX, SY) may be expressed as the intensity relative to the intensity of the light emitted from the point light source (0, 0).

$$E_{D2}(v) \div \{(D_0 - \Delta D)/D_0\} \times E_{D1} \quad (19)$$

Figure 31:
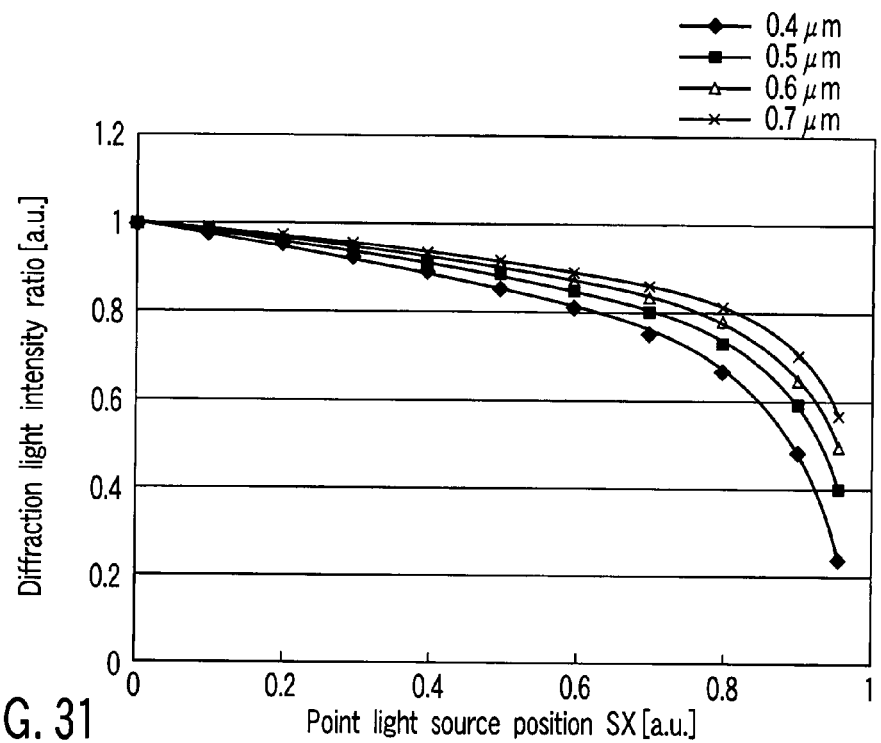
FIG. 31 is a graph showing a relation between a point light source position and diffraction light intensity ratio according to the fourth embodiment of the invention.

FIG. 31 shows the relation between the position of the point light source (SX, 0) and the light intensity of the diffraction light generated in the aperture by the light emitted from each point light source (SX, 0).

Here, it shows the light intensity of the diffraction light generated in the aperture by the light emitted from each point light source (SX, 0) relatively with the light intensity of the diffraction light generated in the aperture by the light emitted from the point light source (0, 0) as 1.

In addition, it shows the respective cases where the designed aperture size $D_0$ is 400 nm, 500 nm, 600 nm, and 700 nm when the film thickness d of the pattern film 100 is 100 nm.

According to the graph shown in FIG. 31, it is found that the light intensity of the diffraction light generated in the aperture by the light emitted from the point light source (SX, 0) is further reduced as the point light source (SX, 0) gets further away from the center of the effective light source.

Then, the light source modulator unit 355 shown in FIG. 30 substitutes the decrease in the light intensity of the light emitted from each point light source (SX, SY) of the effective light source for the decrease in the light intensity of the diffraction light and calculates the modulated intensity distribution Sm (f, g) of the effective light source.

In addition, when a plurality of apertures are provided in the photomask and each design size is different, the modulated intensity distribution Sm (f, g) of the effective light source may be calculated based on the decrease in the light intensity of the diffraction light generated in the aperture having the same design size as the value defined according to the design rule.

The light intensity calculator unit 351b assumes that there is no film thickness of the pattern film 100 and calculates the light intensity distribution of the projection image of the mask pattern of the photomask 5 imaged on the semiconductor substrate which is disposed on the wafer stage 32 shown in FIG. 2, according to the following formula (20) using the modulated intensity distribution Sm (f, g) of the effective light source, by using the design shape of the aperture 101b.

$$I(x, y) = \int S(f, g) \quad (20)$$
$$\left| \int P(f+f_1, g+g_1) \hat{m}(f_1, g_1; f, g) \exp(-2\pi i(f_1 x + g_1 y)) df_1 dg_1 \right|^2$$
$$dfdg$$
$$\approx \int S_m(f, g)$$
$$\left| \int P(f+f_1, g+g_1) \hat{m}(f_1, g_1) \exp(-2\pi i(f_1 x + g_1 y)) df_1 dg_1 \right|^2$$
$$dfdg$$

The data storage device 320b shown in FIG. 30 further comprises a lost area storage unit 321 and an effective light source distribution storage unit 322.

The lost area storage unit 321 stores the lost area calculated by the loss calculator unit 354.

The effective light source distribution storage unit 322 stores the modulated intensity distribution Sm (f, g) of the effective light source calculated by the light source modulator unit 355.

Next, a light intensity distribution simulation method according to the fourth embodiment will be described by using the flow chart shown in FIG. 32.

Figure 32:
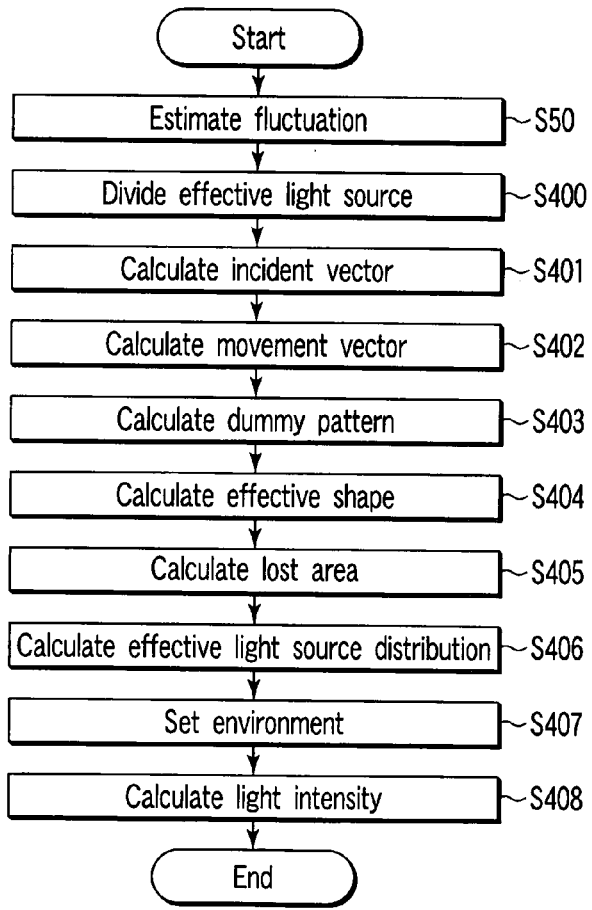
FIG. 32 is a flow chart showing a light intensity distribution simulation method according to the fourth embodiment of the invention.

(a) Step S50 and Step S400 to Step S404 shown in FIG. 32 are performed in the same way as Step S50 and Step S100 to Step S102 shown in FIG. 19.

Next, in Step S405, the loss calculator unit 354 shown in FIG. 30 calculates a lost area for each point light source (SX, SY), in which the lost area is obtained by eliminating the effective shape from the design shape. The loss calculator unit 354 stores the calculated lost area in the lost area storage unit 321.

(b) In Step S406, the light source modulator unit 355 reads out the lost area of the aperture corresponding to each point light source (SX, SY) from the lost area storage unit 321.

Next, the light source modulator unit 355 calculates the decreasing amount of the intensity of the diffraction light generated in the aperture by the light emitted from each point light source (SX, SY), which is caused by the lost area.

Next, the light source modulator unit 355 substitutes the decrease in the intensity of the light emitted from each point light source (SX, SY) of the effective light source for the decrease in the light intensity of the diffraction light and calculates the modulated intensity distribution Sm (f, g) of the effective light source.

The light source modulator unit 355 stores the calculated modulated intensity distribution Sm (f, g) of the effective light source in the effective light source distribution storage unit 322.

(c) In Step S407, the light intensity calculator unit 351b reads out the exposure environment of the exposure apparatus shown in FIG. 2 from the exposure condition storage unit 302. Further, the light intensity calculator unit 351b reads out the design shape of the aperture 101b of the photomask 5 including the pattern film 100 shown in FIGS. 3 to 5 and the disposed position of the aperture 101b when the photomask 5 is disposed on the reticle stage 15 from the mask pattern storage unit 303. Next, the light intensity calculator unit 351b assumes that the film thickness d of the pattern film 100 is zero.

(d) In Step S408, the light intensity calculator unit 351b reads out the modulated intensity distribution Sm (f, g) of the effective light source from the effective light source distribution storage unit 322.

Next, the light intensity calculator unit 351b calculates an intensity distribution of diffraction light generated in the aperture using the formula (20), in which the diffraction light is generated by the light emitted from the point light sources (SX, SY) forming the effective light source 40 entering in the aperture having the design shape, further, the light intensity calculator unit 351b calculates the light intensity distribution of the projection image of the mask pattern of the photomask 5 which is imaged on a semiconductor substrate disposed on the wafer stage 32 shown in FIG. 2. Similarly, the light intensity calculator unit 351b calculates the distribution of the diffraction light generated in the corresponding virtual aperture with respect to the other light emitted from each of the other point light sources (SX, SY), and further calculates the light intensity distribution of the projection image, and hence to complete the light intensity distribution simulation method according to the fourth embodiment.

According to the above mentioned light intensity distribution simulation method relating to the fourth embodiment, fluctuation of the effective shape to the each point light source (SX, SY) of the aperture, due to the film thickness d of the pattern film 100, is substituted with the modulation of the intensity of the light emitted from the each point light source (SX, SY). Therefore, even if assuming the film thickness d of the pattern film 100 is zero, when the light intensity of the diffraction light generated in the aperture having the design shape is calculated, the effect of the film thickness d is reflected in the calculated light intensity. Therefore, it is possible to calculate the light intensity with high accuracy. In addition, once the modulated intensity distribution Sm (f, g) of the effective light source is calculated, it is possible to reflect the effect of the film thickness d in the calculation result of the light intensity of the diffraction light generated in the aperture having the design shape, by using the modulated intensity distribution Sm (f, g) of the effective light source, without calculating the effective shape of the aperture at next time or later.

In addition, as shown in FIG. 31, the modulation of the intensity of the diffraction light generated in the aperture by the light emitted from each point light source (SX, SY) varies depending on the design size of the aperture. Therefore, the modulated intensity distribution SmL (f, g) of the effective light source is calculated for every aperture of different design size, and then the light intensity distribution of the projection image of the mask pattern of the photomask 5 imaged on a semiconductor substrate disposed on the wafer stage 32 maybe calculated using the following formula (21).

$$I(x, y) = \int S(f, g) \left| \int P(f+f_1, g+g_1) \hat{m}(f_1, g_1; f, g) \exp(-2\pi i (f_1 x + g_1 y)) df_1 dg_1 \right|^2 df dg \approx \sum \int S_{mL}(f, g) \left| \int P(f+f_1, g+g_1) \hat{m}_{1L}(f_1, g_1) \exp(-2\pi i (f_1 x + g_1 y)) df_1 dg_1 \right|^2 df dg \tag{21}$$

In addition, in the formula (21), ΣSmL (f, g) is approximated to S (f, g) and ΣmL (f, g) is approximated to m (f, g).

FIFTH EMBODIMENT

Figure 33:
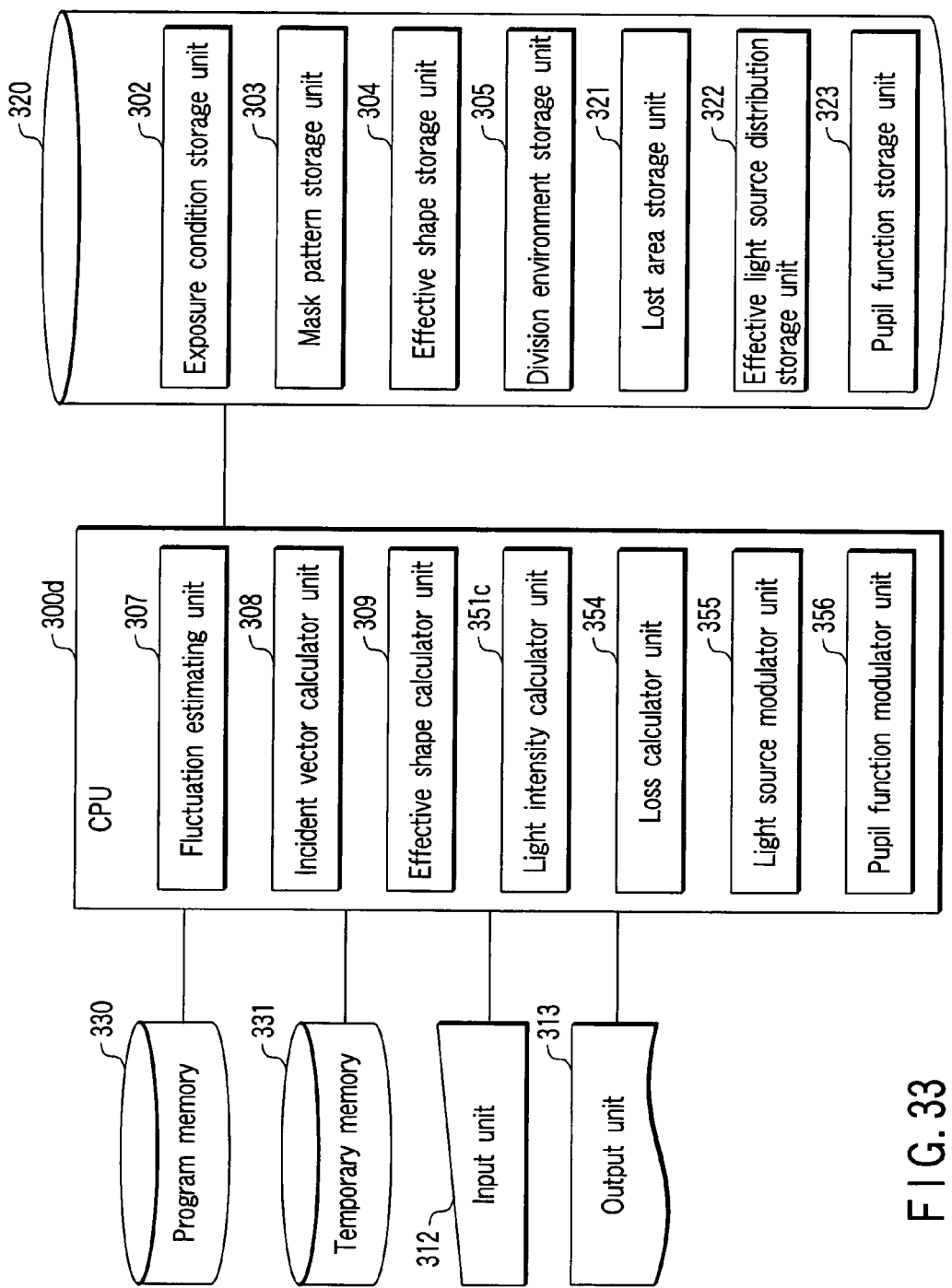
FIG. 33 is a block diagram showing a light intensity distribution simulation system according to a fifth embodiment of the invention.

A light intensity simulation system according to a fifth embodiment is different from the light intensity simulation system shown in FIG. 30 in that the CPU 300d further comprises a pupil function modulator unit 356 as shown in FIG. 33.

Here, when the photomask 5 shown in FIG. 34 includes the pattern film 100 of halftone, the intensity distribution of the effective light source is projected on the incident pupil 24 as the intensity distribution of the zero-order diffraction light. In the second embodiment, it has been described that the effect of the film thickness d of the pattern film may be reflected in the simulation result by substituting the decrease in the light intensity of the diffraction light generated in the aperture with the decrease in the intensity of the light emitted from each point light source (SX, SY) of the effective light source. Here, the effect of the film thickness d of the pattern film may be reflected in the simulation result by further substituting the modulated intensity distribution Sm (f, g) of the effective light source with the modulation of the pupil function P (f+f1, g+g1).

Therefore, the pupil function modulator unit 356 shown in FIG. 33 calculates Pm (f+f1, g+g1) which is modulated pupil function P (f+f1, g+g1), based on the modulated intensity distribution Sm (f+f1, g+g1) of the effective light source.

Assuming that the film thickness of the pattern film 100 is zero, the light intensity calculator 351c calculates the light intensity distribution of the projection image of the mask pattern of the photomask 5 imaged on a semiconductor substrate disposed on the wafer stage 32 shown in FIG. 2, by the following formula (22) using the modulated pupil function Pm (f+f1, g+g1), using the design shape of the aperture 101b.

$$I(x, y) = \int S(f, g) \left| \int P(f+f_1, g+g_1)\hat{m}(f_1, g_1; f, g)\exp(-2\pi i(f_1 x + g_1 y))df_1 dg_1 \right|^2 dfdg \approx \int S(f, g) \left| \int P_m(f+f_1, g+g_1)\hat{m}(f_1, g_1)\exp(-2\pi i(f_{1x} + g_{1y}))dg_1 dg_1 \right|^2 dfdg \quad (22)$$

The data storage 320c shown in FIG. 33 further comprises a pupil function storage unit 323. The pupil function storage unit 323 stores the modulated pupil function Pm (f+f1, g+g1) which is calculated by the pupil function modulator unit 356.

Next, a light intensity distribution simulation method according to the fifth embodiment will be described by using the flow chart shown in FIG. 35.

Figure 35:
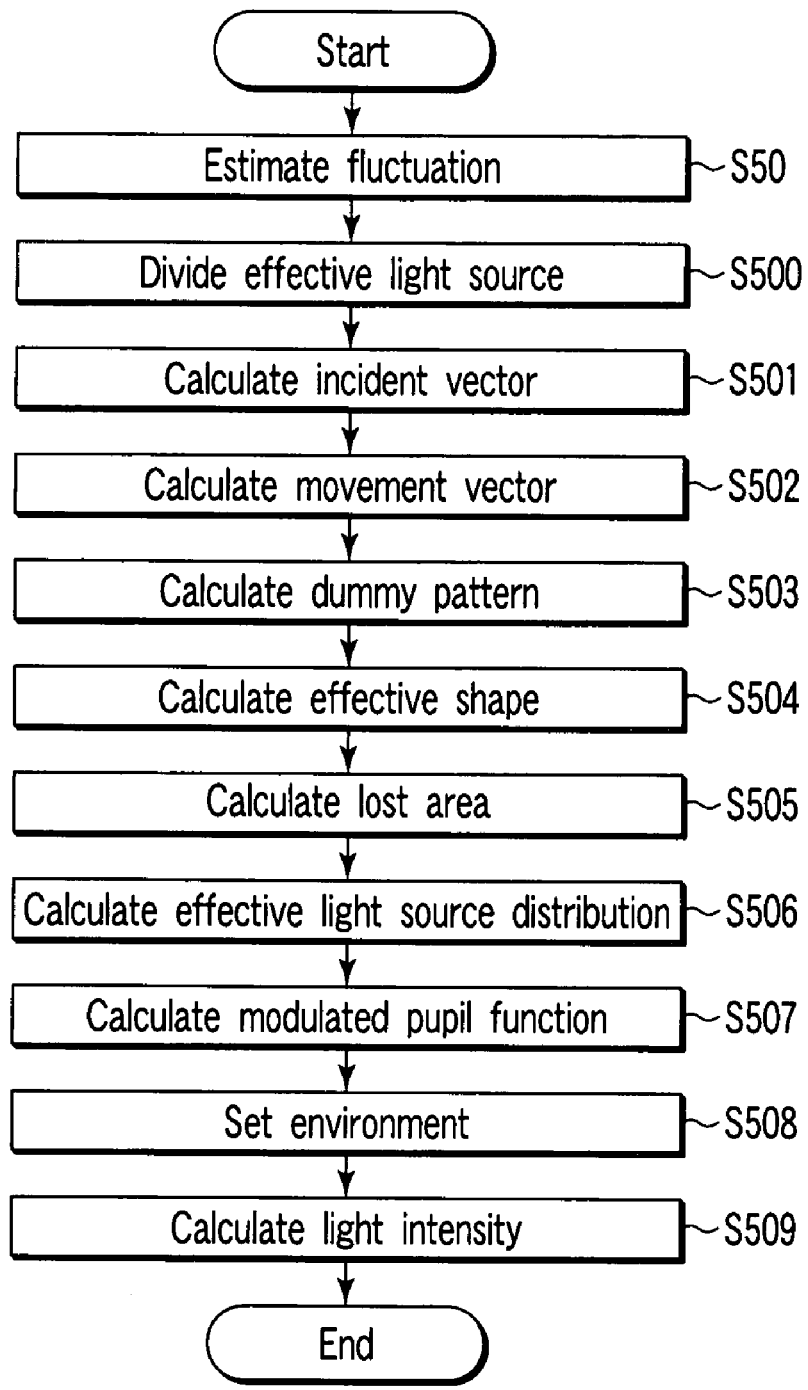
FIG. 35 is a flow chart showing a light intensity distribution simulation method according to the fifth embodiment of the invention.

(a) Step S50 and Step S500 to Step S506 shown in FIG. 35 are performed in the same way as Step S50 and Step S400 to Step S406 shown in FIG. 32.

In Step S507, the pupil function modulator unit 356 reads out the modulated intensity distribution Sm (f, g) of the effective light source from the effective light source distribution storage unit 322.

Next, the pupil function modulator unit 356 calculates Pm (f+f1, g+g1) which is modulated pupil function P (f+f1, g+g1), based on the modulated intensity distribution Sm (f, g) of the effective light source. The pupil function modulator unit 356 stores the calculated modulated pupil function Pm (f+f1, g+g1) in the pupil function storage unit 323.

(b) In Step S508, the light intensity calculator 351c reads out the exposure environment of the exposure apparatus shown in FIG. 2 from the exposure condition storage unit 302. Further, the light intensity calculator 351c reads out the design shape of the aperture 101b of the photomask 5 including the pattern film 100 shown in FIGS. 3 to 5 and the disposed position of the aperture 101b when the photomask 5 is disposed on the reticle stage 15, from the mask pattern storage unit 303. Next, the light intensity calculator 351c assumes that the film thickness d of the pattern film 100 is zero.

(c) In Step S509, the light intensity calculator 351c reads out the modulated pupil function Pm (f+f1, g+g1) from the pupil function storage unit 323.

Next, the light intensity calculator 351c calculates the intensity distribution of the diffraction light in the aperture, in which the intensity distribution is generated by the light emitted from the point light source (SX, SY) forming the effective light source 40 and enters in the aperture having the design shape, and further the light intensity calculator 351c calculates the light intensity distribution of the projection image of the mask pattern of the photomask 5 which is imaged on a semiconductor substrate disposed on the wafer stage 32 shown in FIG. 2, according to the formula (22). Similarly, as for each light emitted from the other point light sources (SX, SY), the light intensity calculator 351c calculates the intensity distribution of the diffraction light generated in the corresponding virtual aperture, and further the light intensity calculator 351c calculates the light intensity distribution of the projection image, and hence to complete the light intensity distribution simulation method according to the fifth embodiment.

According to the above-mentioned light intensity distribution simulation method according to the fifth embodiment, fluctuation in the effective shape of the aperture, corresponding to each point light source (SX, SY), caused by the film thickness d of the pattern film 100, is substituted with the modulation of the pupil function P (f+f1, g+g1). Therefore, even if assuming the film thickness d of the pattern film 100 is zero, when the light intensity of the diffraction light generated in the aperture having the design shape is calculated, the effect of the film thickness d is reflected in the calculated light intensity. Therefore, it is possible to calculate the light intensity with high accuracy. In addition, once the modulated pupil function Pm (f+f1, g+g1) is calculated, it is possible to reflect the effect of the film thickness d in the calculation result of the light intensity of the diffraction light generated in the aperture having the design shape by using the modulated pupil function Pm (f+f1, g+g1) without calculating the effective shape of the aperture at next time or later.

Instead of modulating the pupil function P (f+f1, g+g1), a function TCCm (f+f1, g+g1; f1, g1) which is modulated transfer function TCC (f+f1, g+g1; f1, g1) may be used to calculate the light intensity, as shown in the following formulas (23) and (24). Further, by using the modulated transfer function TCCm (f+f1, g+g1; f1, g1) and applying an optimal coherent approximation (OCA) method used for the calculation of optical proximity correction (OPC), it is possible to shorten the calculation time more. A kernel is generated by OCA development, the light intensity of the projection light is calculated.

$$I(x,y) = \int (\int \int TCC_m(f+f_1,g+g_1;f_1,g_1)\hat{m}(f+f_1,g+g_1) \hat{m}^*(f_1,g_1)df_1 dg_1)\exp(-2\pi i(fx+gy))dfdg \quad (23)$$

$$TCC_m(f_1,g_1;f_2,g_2) = \int \int S_m(f,g)P(f+f_1,g+g_1)P(f+f_2,g+g_2) dfdg \quad (24)$$

The invention is not limited to above embodiments. For example, in the above light intensity distribution simulation method, a change in the polarized light condition generated by the structure of the mask pattern and a waveguide effect generated by the case where the size of the mask pattern becomes the same as the wavelength of the light have not been described. However, the change in the polarized light condition and the waveguide effect may be taken in the above light intensity distribution simulation method so as to improve the calculation accuracy. In addition, the light intensity distribution simulation method may be expressed as sequential processing or operations in time series. Therefore, in order to perform the light intensity distribution simulation method by the CPU 300a shown in FIG. 1, the light intensity distribution simulation method shown in FIG. 19 may be realized by the computer program product for specifying a plurality of functions executed by a processor within the CPU 300a. That is, as is shown in FIG. 36, the above-described light intensity distribution simulation method of the embodiments can be realized as a computer program product 32 which stores a program 31 that is to be executed by a system including a computer 30. For example, the computer program product according to the embodiment is configured to cause the computer 30 to execute the steps (instructions) of FIG. 19, the steps (instructions) of FIG. 25, the steps (instructions) of FIG. 28, the steps (instructions) of FIG. 32, or the steps (instructions) of FIG. 35. The computer program product is a recording medium or a recording device which may input and output data to and from the CPU 300a. The recording medium includes a memory, a magnetic disk, an optical disk, and the other program recording device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light intensity distribution simulation method for predicting an intensity distribution of light on a substrate when a photomask comprising a pattern is irradiated with light in which a shape distribution of an effective light source is defined, by using an illumination optical system, and the light which passes through the photomask is projected on the substrate through a projection optical system, the method comprising:

extracting a plurality of point light sources from the shape distribution of the effective light source;

entering light in the pattern of the photomask, the light being emitted from each of the plurality of point light sources;

calculating an effective shape for each of the plurality of point light sources by a CPU, the effective shape being a shape obtained by excluding a part from a design shape of an aperture of the pattern, the part being failed to be irradiated with the light directly due to a sidewall of a pattern film including the pattern; and calculating a distribution of diffraction light generated in the pattern for each of the plurality of point light sources by a CPU by using the effective shape calculated for each of the plurality of point light sources.

2. The light intensity distribution simulation method according to claim 1, wherein the calculating the effective shape comprises calculating a movement vector of the light on a plane parallel to the pattern film when the light which is entered in the photomask at an incident angle defined at each position of the plurality of point light sources, proceeds the same distance as a film thickness of the pattern film in a direction vertical to the pattern film;

calculating a dummy pattern aperture obtained by moving the design shape in parallel according to the movement vector; and calculating logical multiplication of the design shape of the aperture of the pattern and the dummy pattern aperture.

3. The light intensity distribution simulation method according to claim 2, wherein the plurality of point light sources are arranged on a grid in which the shape distribution area of the effective light source is divided at regular intervals on a pupil surface.

4. The light intensity distribution simulation method according to claim 2, wherein each of the plurality of point light sources is arranged in a manner that the intervals of the plurality of point light sources reduce toward an edge of an optical axis of the effective light source from a center of the optical axis.

5. The light intensity distribution simulation method according to claim 1, wherein calculating the effective shape comprises calculating a movement vector of the light on a plane parallel to the pattern film when the light which is entered in the photomask at an incident angle defined at each position of the plurality of point light sources, proceeds the same distance as a film thickness of the pattern film in a direction vertical to the pattern film;

calculating a shadow pattern, the shadow pattern comprising the movement vector and each side vector of a plurality of sides which form the design shape; and calculating logical multiplication of NOT of the shadow pattern and the design shape.

6. The light intensity distribution simulation method according to claim 5, wherein the plurality of point light sources are arranged on a grid in which the shape distribution area of the effective light source is divided at regular intervals on a pupil surface.

7. The light intensity distribution simulation method according to claim 5, wherein each of the plurality of point light sources is arranged in a manner that the intervals of the plurality of point light sources reduce toward an edge of an optical axis of the effective light source from a center of the optical axis.

8. The light intensity distribution simulation method according to claim 1, wherein the plurality of point light sources are arranged on a grid in which a shape distribution area of the effective light source is divided at regular intervals on a pupil surface.

9. The light intensity distribution simulation method according to claim 1, wherein each of the plurality of point light sources is arranged in a manner that the intervals of the plurality of point light sources reduce toward an edge of an optical axis of the effective light source from a center of the optical axis.

10. A computer program product comprising a recording medium for storing program instructions for predicting an intensity distribution of light on a substrate when a photomask comprising a pattern is irradiated with light in which a shape distribution of an effective light source is defined, by using an illumination optical system, and the light which passes through the photomask is projected on the substrate through a projection optical system, the program instructions being executed on a computer system enabling the computer system to perform:

an instruction for extracting a plurality of point light sources from the shape distribution of the effective light source;

an instruction for entering light in the pattern of the photomask, the light being emitted from each of the plurality of point light sources;

an instruction for calculating an effective shape for each of the plurality of point light sources, the effective shape being a shape obtained by excluding a part from a design shape of an aperture of the pattern, the part being failed to be irradiated with the light directly due to a sidewall of a pattern film including the pattern; and an instruction for calculating a distribution of diffraction light generated in the pattern for each of the plurality of point light sources by using the effective shape calculated for each of the plurality of point light sources.

11. The computer program product according to claim 10, wherein the instruction for calculating the effective shape comprises
- calculating a movement vector of the light on a plane parallel to the pattern film when the light which is entered in the photomask at an incident angle defined at each position of the plurality of point light sources, proceeds the same distance as a film thickness of the pattern film in a direction vertical to the pattern film;
- calculating a dummy pattern aperture obtained by moving the design shape in parallel according to the movement vector; and
- calculating logical multiplication of the design shape of the aperture of the pattern and the dummy pattern aperture.

12. The computer program product according to claim 11, wherein the plurality of point light sources are arranged on a grid in which the shape distribution area of the effective light source is divided at regular intervals on a pupil surface.

13. The computer program product according to claim 11, wherein each of the plurality of point light sources is arranged in a manner that the intervals of the plurality of point light sources reduce toward an edge of an optical axis of the effective light source from a center of the optical axis.

14. The computer program product according to claim 10, wherein the instruction for calculating the effective shape comprises
- calculating a movement vector of the light on a plane parallel to the pattern film when the light which is entered in the photomask at an incident angle defined at each position of the plurality of point light sources, proceeds the same distance as a film thickness of the pattern film in a direction vertical to the pattern film;
- calculating a shadow pattern, the shadow pattern comprising the movement vector and each side vector of a plurality of sides which form the design shape; and
- calculating logical multiplication of NOT of the shadow pattern and the design shape.

15. The computer program product according to claim 14, wherein the plurality of point light sources are arranged on a grid in which the shape distribution area of the effective light source is divided at regular intervals on a pupil surface.

16. The computer program product according to claim 14, wherein each of the plurality of point light sources is arranged in a manner that the intervals of the plurality of point light sources reduce toward an edge of an optical axis of the effective light source from a center of the optical axis.

17. The computer program product according to claim 10, wherein the plurality of point light sources are arranged on a grid in which a shape distribution area of the effective light source is divided at regular intervals on a pupil surface.

18. The computer program product according to claim 10, wherein each of the plurality of point light sources is arranged in a manner that the intervals of the plurality of point light sources reduce toward an edge of an optical axis of the effective light source from a center of the optical axis.

* * * * *